(12) United States Patent
Senoo et al.

(10) Patent No.: US 10,700,054 B2
(45) Date of Patent: Jun. 30, 2020

(54) SEMICONDUCTOR APPARATUS

(71) Applicant: DENSO CORPORATION, Kariya-shi (JP)

(72) Inventors: Masaru Senoo, Okazaki (JP); Jun Okawara, Nisshin (JP)

(73) Assignee: DENSO CORPORATION, Kariya-shi (JP)

( * ) Notice: Subject to any disclaimer, the term of this patent is extended or adjusted under 35 U.S.C. 154(b) by 0 days.

(21) Appl. No.: 16/236,678

(22) Filed: Dec. 31, 2018

(65) Prior Publication Data

US 2019/0214379 A1 Jul. 11, 2019

(30) Foreign Application Priority Data

Jan. 11, 2018 (JP) .................. 2018-002859

(51) Int. Cl.
*H01L 27/02* (2006.01)
*H01L 29/739* (2006.01)
*H01L 29/08* (2006.01)
*H01L 29/861* (2006.01)

(52) U.S. Cl.
CPC ...... *H01L 27/0255* (2013.01); *H01L 29/0834* (2013.01); *H01L 29/7397* (2013.01); *H01L 29/8611* (2013.01)

(58) Field of Classification Search
CPC ............. H01L 27/0255; H01L 29/0834; H01L 29/7397; H01L 29/8611; H01L 29/0696; H01L 29/1095; H01L 29/7375; H01L 29/7393–7395; H01L 29/66325; H01L 29/66333–66348
See application file for complete search history.

(56) References Cited

U.S. PATENT DOCUMENTS

| | | |
|---|---|---|
| 2012/0132954 A1 | 5/2012 | Kouno et al. |
| 2014/0048847 A1 | 2/2014 | Yamashita et al. |
| 2015/0262999 A1 | 9/2015 | Ogura |
| 2016/0071964 A1 | 3/2016 | Kitagawa |

FOREIGN PATENT DOCUMENTS

| | | |
|---|---|---|
| JP | 2013-48230 | 3/2013 |
| JP | 2013-138069 A | 7/2013 |
| JP | 2015-177057 | 10/2015 |
| JP | 2016-58428 | 4/2016 |
| KR | 10-2008-0019529 A | 3/2008 |
| WO | WO 2017/146148 A1 | 8/2017 |

*Primary Examiner* — Cuong B Nguyen
(74) *Attorney, Agent, or Firm* — Oblon, McClelland, Maier & Neustadt, L.L.P.

(57) ABSTRACT

A semiconductor apparatus includes a semiconductor substrate provided with a plurality of diode ranges and a plurality of IGBT ranges. The IGBT ranges and the diode ranges are alternately arranged along a first direction in plan view of the semiconductor substrate along a thickness direction of the semiconductor substrate. Each diode range is provided with a plurality of n-type cathode regions and a plurality of p-type current-limiting regions in a range of being in contact with a lower electrode. The cathode regions and the current-limiting regions are alternately arranged along a second direction intersecting the first direction in each diode range. Each IGBT range is provided with a p-type collector region in a range of being in contact with the lower electrode. The collector region in each IGBT range is in contact with each cathode region in the adjacent diode range.

10 Claims, 23 Drawing Sheets

SEMICONDUCTOR APPARATUS

INCORPORATION BY REFERENCE

The disclosure of Japanese Patent Application No. 2018-002859 filed on Jan. 11, 2018 including the specification, drawings and abstract is incorporated herein by reference in its entirety.

BACKGROUND

1. Technical Field

The present disclosure relates to a semiconductor apparatus.

2. Description of Related Art

Japanese Unexamined Patent Application Publication No. 2013-048230 (JP 2013-048230 A) discloses a semiconductor apparatus that is provided with a diode and an insulated gate bipolar transistor (IGBT) in one semiconductor substrate. FIG. 23 shows one semiconductor apparatus disclosed in JP 2013-048230 A. In the semiconductor apparatus of FIG. 23, diode ranges 570 and IGBT ranges 580 are alternately arranged along an x direction. Each diode range 570 has a plurality of n-type cathode regions 520 and a plurality of p-type current-limiting regions 518 in a range of being in contact with a lower electrode 560. The cathode regions 520 and the current-limiting regions 518 are alternately arranged along the x direction. Each IGBT range 580 has a p-type collector region 516 in a range of being in contact with the lower electrode 560. The collector region 516 is in contact with a cathode region 520a closest to the IGBT range 580 among the cathode regions 520 in the diode range 570. An n-type drift region 522 is disposed above the cathode region 520, the current-limiting regions 518, and the collector region 516. A p-type body region 524 is disposed above the drift region 522. The body region 524 is in contact with an upper electrode 550 in the IGBT range 580 and the diode range 570. In the diode range 570, a diode is formed of the body region 524, the drift region 522, and the cathode region 520. The body region 524 in the diode range 570 functions as an anode region of the diode. In the IGBT range 580, an n-type emitter region 532, a trench 526, a gate insulating film 528, a gate electrode 530, and the like are provided. In the IGBT range 580, an IGBT is formed of the emitter region 532, the body region 524, the drift region 522, the collector region 516, the gate electrode 530, and the like.

When a potential of the upper electrode 550 is made to be higher than a potential of the lower electrode 560, the diode in the diode range 570 is turned on. When the diode is turned on, as indicated by an arrow 590, holes flow from the body region 524 toward the cathode region 520 through the drift region 522. With the holes flowing into the cathode region 520, a current flows from the cathode region 520 toward the body region 524 through the drift region 522. Thereafter, when the potential of the upper electrode 550 is made to be lower than the potential of the lower electrode 560, the diode performs a recovery operation. That is, holes in the drift region 522 are discharged to the upper electrode 550 through the body region 524, and electrons in the drift region 522 are discharged to the lower electrode 560 through the cathode region 520. For this reason, a reverse current (hereinafter, simply referred to as a "recovery current") flows instantaneously in the diode. When a large number of electrons are present in the drift region 522 in a state in which the diode is turned on, since electrons that are discharged to the lower electrode 560 at the time of the recovery operation become large, the recovery current becomes high. In the semiconductor apparatus of JP 2013-048230 A, in order to suppress the recovery current, the p-type current-limiting regions 518 are provided in a range of being in contact with the lower electrode 560 in the diode range 570. When the current-limiting regions 518 are provided, since the area of the cathode region 520 becomes small, electrons that flow from the cathode region 520 into the drift region 522 when the diode is turned on become small. For this reason, the electrons that are discharged to the lower electrode 560 at the time of the recovery operation also become small. Therefore, the recovery current is suppressed.

SUMMARY

Similarly to the body region 524 in the diode range 570, the body region 524 in the IGBT range 580 is in contact with the upper electrode 550. For this reason, when the diode in the diode range 570 is turned on, holes flow from the body region 524 into the drift region 522 in the IGBT range 580. The holes that flow into the drift region 522 in the IGBT range 580 flow toward the cathode region 520 in the diode range 570 as indicated by an arrow 592. At this time, most of the holes in the drift region 522 in the IGBT range 580 flow into the cathode region 520a closest to the IGBT range 580. Electrons flow in an opposite direction of the arrow 592. For this reason, in a state in which the diode is turned on, a plurality of electrons is present on a current path (that is, the drift region 522 in the IGBT range 580) indicated by the arrow 592. When the diode performs the recovery operation, electrons in the drift region 522 in the IGBT range 580 flow toward the cathode region 520a as indicated by the arrow 592. For this reason, the recovery current concentrates in the cathode region 520a. Accordingly, the cathode region 520a locally increases to a high temperature at the time of the recovery operation, and a high load is applied to the cathode region 520a. The present disclosure provides a semiconductor apparatus that has a current-limiting region and is capable of suppressing concentration of a recovery current.

A first aspect of the present disclosure relates to a semiconductor apparatus. The semiconductor apparatus includes a semiconductor substrate, an upper electrode disposed on an upper surface of the semiconductor substrate, a lower electrode disposed on a lower surface of the semiconductor substrate, a trench, a gate insulating film, and a gate electrode. The semiconductor substrate is provided with a plurality of diode ranges and a plurality of IGBT ranges. The IGBT ranges and the diode range are alternately arranged along a first direction in plan view of the semiconductor substrate along a thickness direction of the semiconductor substrate. Each diode range is provided with a plurality of n-type cathode regions and a plurality of p-type current-limiting regions in a range of being in contact with the lower electrode. The cathode regions and the current-limiting regions are alternately arranged along a second direction intersecting the first direction in each diode range in plan view of the semiconductor substrate along the thickness direction. Each IGBT range is provided with a p-type collector region in a range of being in contact with the lower electrode. The collector region in each IGBT range is in contact with each cathode region in the adjacent diode range. The semiconductor substrate has a drift region, a body region, and an emitter region. The drift region is an n-type region that is distributed over the diode ranges and the IGBT ranges, and is disposed above the cathode regions, the current-limiting regions, and the collector regions. The body region is a p-type region that is distributed over the diode ranges and the IGBT ranges, is disposed above the drift region, and is in contact with the upper electrode in each diode range and each IGBT range. The emitter region is an n-type region that is disposed in each IGBT range, is in contact with the upper electrode, and is separated from the drift region by the body region. The trench extends to have a depth passing through the emitter region and the body region from the upper surface of the semiconductor substrate and reaching the drift region. The gate insulating film covers an inner surface of the trench. The gate electrode is disposed in the trench and is insulated from the semiconductor substrate by the gate insulating film.

The cathode region may be in direct contact with the drift region above the cathode region, or a p-type region may be disposed between the cathode region and the drift region above the cathode region. Furthermore, the drift region may be in direct contact with the body region above the drift region, or other regions (for example, a region where a p-type region and an n-type region are laminated) may be disposed between the drift region and the body region above the drift region.

In the semiconductor apparatus according to the first aspect of the present disclosure, the cathode regions and the current-limiting regions are alternately arranged along the second direction (that is, the direction intersecting the first direction in which the IGBT ranges and the diode ranges are alternately arranged). For this reason, the collector region in each IGBT range is in contact with each cathode region in the adjacent diode range. For this reason, when the diode is turned on and holes flow from the body region in the IGBT range into the drift region, the holes flow from the drift region in the IGBT range into each cathode region. That is, the holes flow into each cathode region in a dispersed manner without flowing into a specific cathode region in a concentrated manner. Accordingly, a recovery current flows in each cathode region in a dispersed manner even at the time of the recovery operation. Therefore, an increase of solely a specific cathode region to a high temperature and application of a high load to the specific cathode region at the time of the recovery operation are suppressed. As a result, according to the configuration of the semiconductor apparatus described above, it is possible to realize high reliability compared to the semiconductor apparatus of the related art.

In the semiconductor apparatus according to the first aspect of the present disclosure, each cathode region may extend long along the first direction in plan view of the semiconductor substrate along the thickness direction. The length of each cathode region in the first direction may be longer than the thickness of the semiconductor substrate.

According to the aspect of the present disclosure, when a current flows in each cathode region, the current flows in the first direction in a dispersed manner. With this, it is possible to suppress an increase in temperature of each cathode region.

In the semiconductor apparatus according to the first aspect of the present disclosure, the diode range may have a p-type hole blocking region that is in contact with at least a part of an upper surface of each cathode region. The drift region may be in contact with an upper surface of the hole blocking region.

According to the aspect of the present disclosure, flowing of holes from the drift region into the cathode region when the diode is turned on is suppressed by the hole blocking region. With this, it is possible to suppress the recovery current.

In the semiconductor apparatus according to the aspect of the present disclosure, the hole blocking region may be in contact with a part of an upper surface of each cathode region. The drift region may be in contact with an upper surface of the cathode region in a range in which the hole blocking region is not present.

According to the aspect of the present disclosure, it is possible to control the amount of holes flowing from the drift region into the cathode region to a proper amount. Accordingly, it is possible to balance a loss that occurs when the diode is turned on and a loss that occurs when the diode performs a recovery operation.

In the semiconductor apparatus according to the aspect of the present disclosure, the hole blocking region may be in contact with an upper surface of an end portion of the cathode region in the first direction.

According to the aspect of the present disclosure, it is possible to suppress concentration of a current in the end portion of the cathode region in the first direction.

In the semiconductor apparatus according to the aspect of the present disclosure, the hole blocking region may be in contact with at least one of the current-limiting regions.

According to the aspect of the present disclosure, holes that flow from the drift region into the hole blocking region when the diode is turned on flow in the lower electrode through the current-limiting region. With this, the holes easily flow from the drift region into the hole blocking region, and it is possible to more effectively suppress flowing of the holes into the cathode region.

In the semiconductor apparatus according to the aspect of the present disclosure, the hole blocking region may extend long in the second direction and may be in contact with upper surfaces of a plurality of cathode regions.

According to the aspect of the present disclosure, it is possible to suppress flowing of the holes into the cathode regions with one hole blocking region.

In the semiconductor apparatus according to the aspect of the present disclosure, each diode range may be provided with a plurality of hole blocking regions.

According to the aspect of the present disclosure, it is possible to more appropriately suppress flowing of the holes into the cathode region.

In the semiconductor apparatus according to the aspect of the present disclosure, the drift region may have a buffer region that is in contact with the upper surface of the cathode region and has an n-type impurity concentration lower than the cathode region, and a low concentration region that is in contact with an upper surface of the buffer region and has an n-type impurity concentration lower than the buffer region. A p-type impurity concentration of the hole blocking region may be lower than a p-type impurity concentration of the collector region, a p-type impurity concentration of the current-limiting region, and the n-type impurity concentration of the buffer region.

The p-type impurity concentration of the hole blocking region is made to be low as described above, whereby the holes easily flow into the hole blocking region when the diode is turned on. With this, it is possible to effectively suppress flowing of the holes into the cathode region.

In the semiconductor apparatus according to the first aspect of the present disclosure, the trench may extend long along the second direction in plan view of the semiconductor substrate along the thickness direction.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
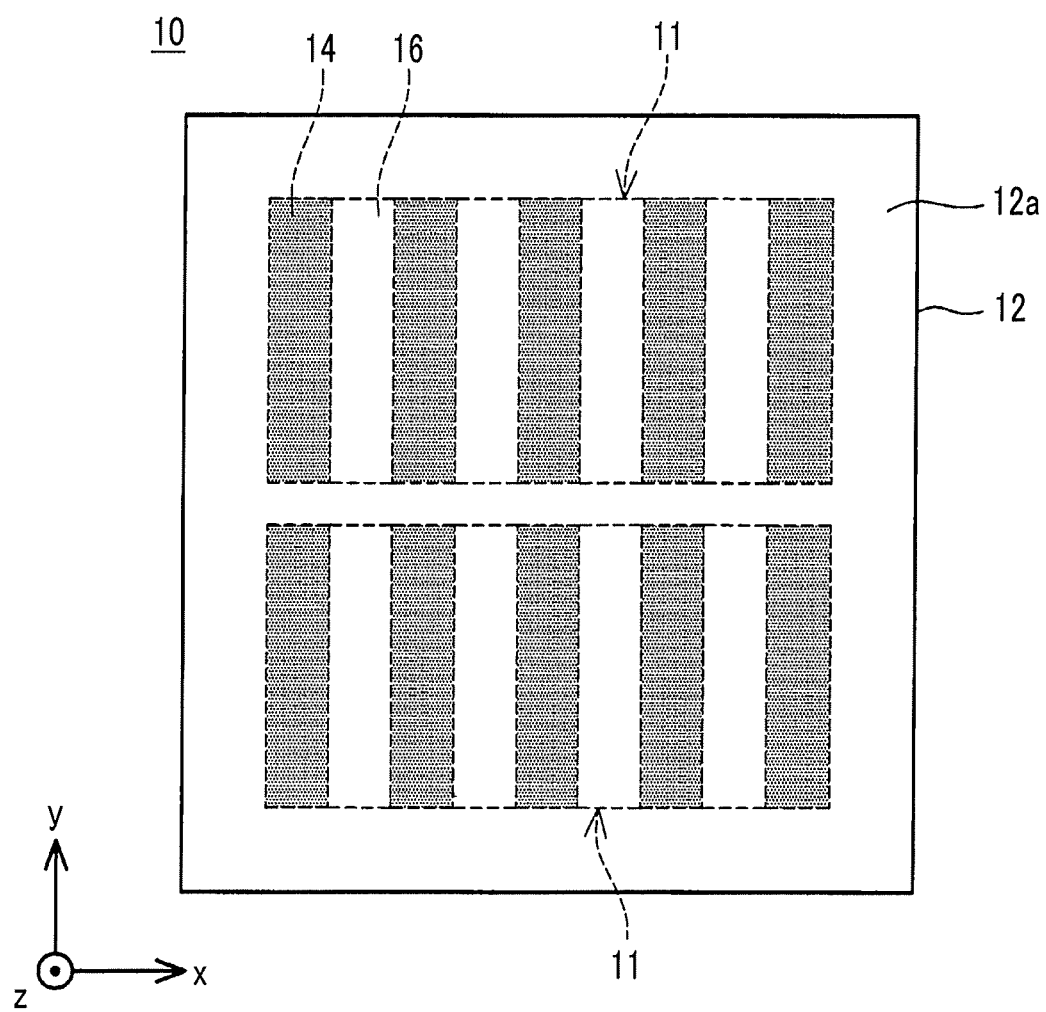
FIG. 1 is a plan view of a semiconductor apparatus of an example.

A semiconductor apparatus 10 shown in FIG. 1 has a semiconductor substrate 12 made of silicon. FIG. 1 is a plan view of the semiconductor substrate 12 when viewed from the top along a thickness direction of the semiconductor substrate 12. Hereinafter, one direction parallel to an upper surface 12a of the semiconductor substrate 12 is referred to as an x direction, a direction parallel to the upper surface 12a and orthogonal to the x direction is referred to as a y direction, and the thickness direction of the semiconductor substrate 12 is referred to as a z direction. As shown in FIG. 1, the semiconductor substrate 12 is provided with two element regions 11. In each element region 11, a plurality of diode ranges 14 and a plurality of IGBT ranges 16 are provided. In each element region 11, the diode ranges 14 and the IGBT ranges 16 are alternately arranged in the x direction.

Figure 2:
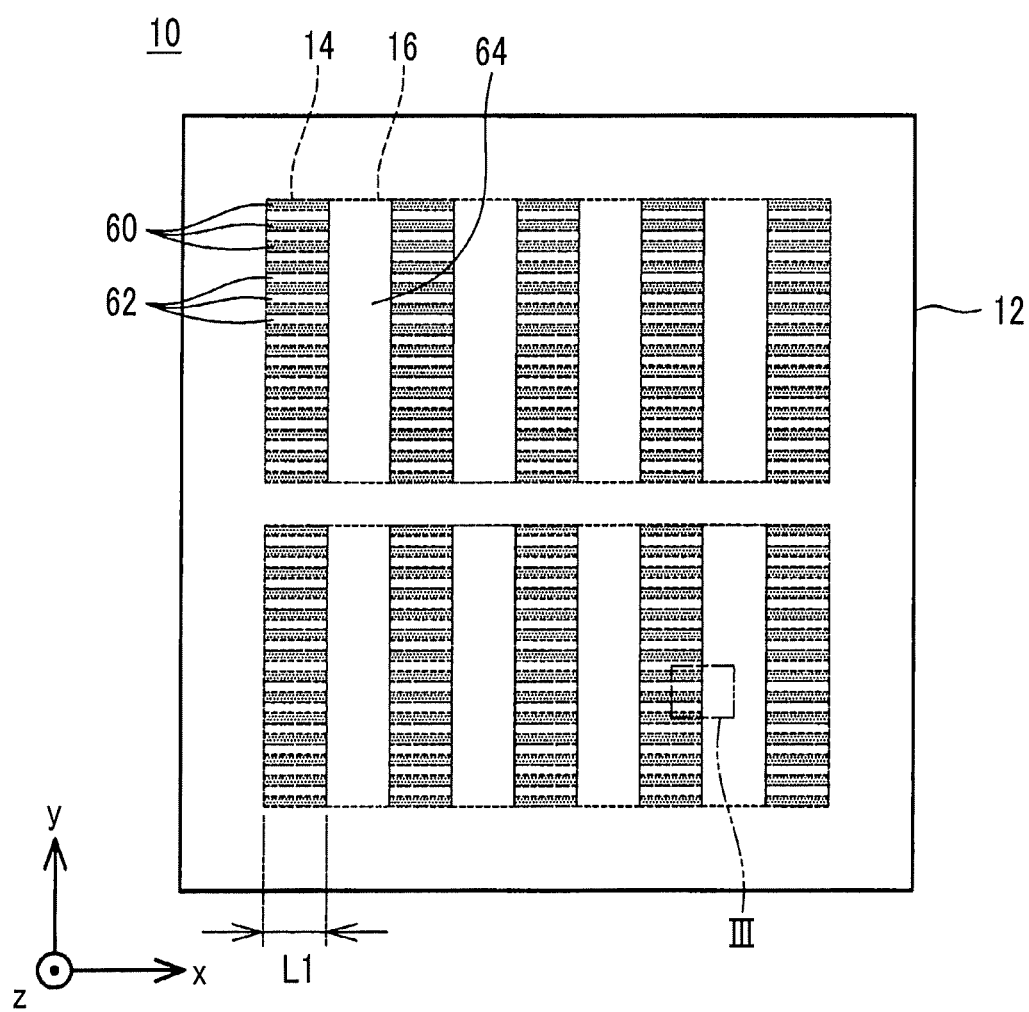
FIG. 2 is a plan view showing a distribution of cathode regions and current-limiting regions in the semiconductor apparatus of the example.

FIG. 2 shows a distribution of regions that are provided in a semiconductor layer in a range of being exposed to a lower surface 12b of the semiconductor substrate 12. FIG. 2 shows the distribution of the regions in plan view when the semiconductor substrate 12 is viewed from the top along the z direction as in FIG. 1. As shown in FIG. 2, in a range of being exposed to the lower surface 12b of the semiconductor substrate 12, n-type cathode regions 60, p-type current-limiting regions 62, and a p-type collector region 64 are provided. In each diode range 14, a plurality of cathode regions 60 and a plurality of current-limiting regions 62 are provided. In each diode range 14, the cathode regions 60 and the current-limiting regions 62 are alternately arranged in the y direction. In other words, the p-type region sandwiched between the two cathode regions 60 in the y direction is the current-limiting region 62. A range in which the cathode regions 60 and the current-limiting regions 62 are alternately arranged in the y direction in plan view of the semiconductor substrate 12 along the z direction is the diode range 14. Each cathode region 60 and each current-limiting region 62 extend long in the x direction. The length L1 of each cathode region 60 in the x direction is longer than the thickness T1 (see FIG. 4) of the semiconductor substrate 12. The collector region 64 is provided in the whole of each IGBT range 16 in plan view of the semiconductor substrate 12 as in FIG. 2. In other words, when the semiconductor substrate 12 is viewed along the z direction, the p-type region that is distributed widely in the y direction from the current-limiting region 62 is the collector region 64. In plan view of the semiconductor substrate 12 along the z direction, a range in which the collector region 64 is distributed is the IGBT range 16. Each collector region 64 is in contact with an end surface of each cathode region 60 in the adjacent diode range 14. Each collector region 64 is in contact with an end surface of each current-limiting region 62 in the adjacent diode range 14. A p-type impurity concentration of each collector region 64 is equal to a p-type impurity concentration of each current-limiting region 62 (in the present disclosure, "equal" also includes a meaning of "substantially equal"). Each collector region 64 and each current-limiting region 62 are continuous p-type regions.

Figure 3:
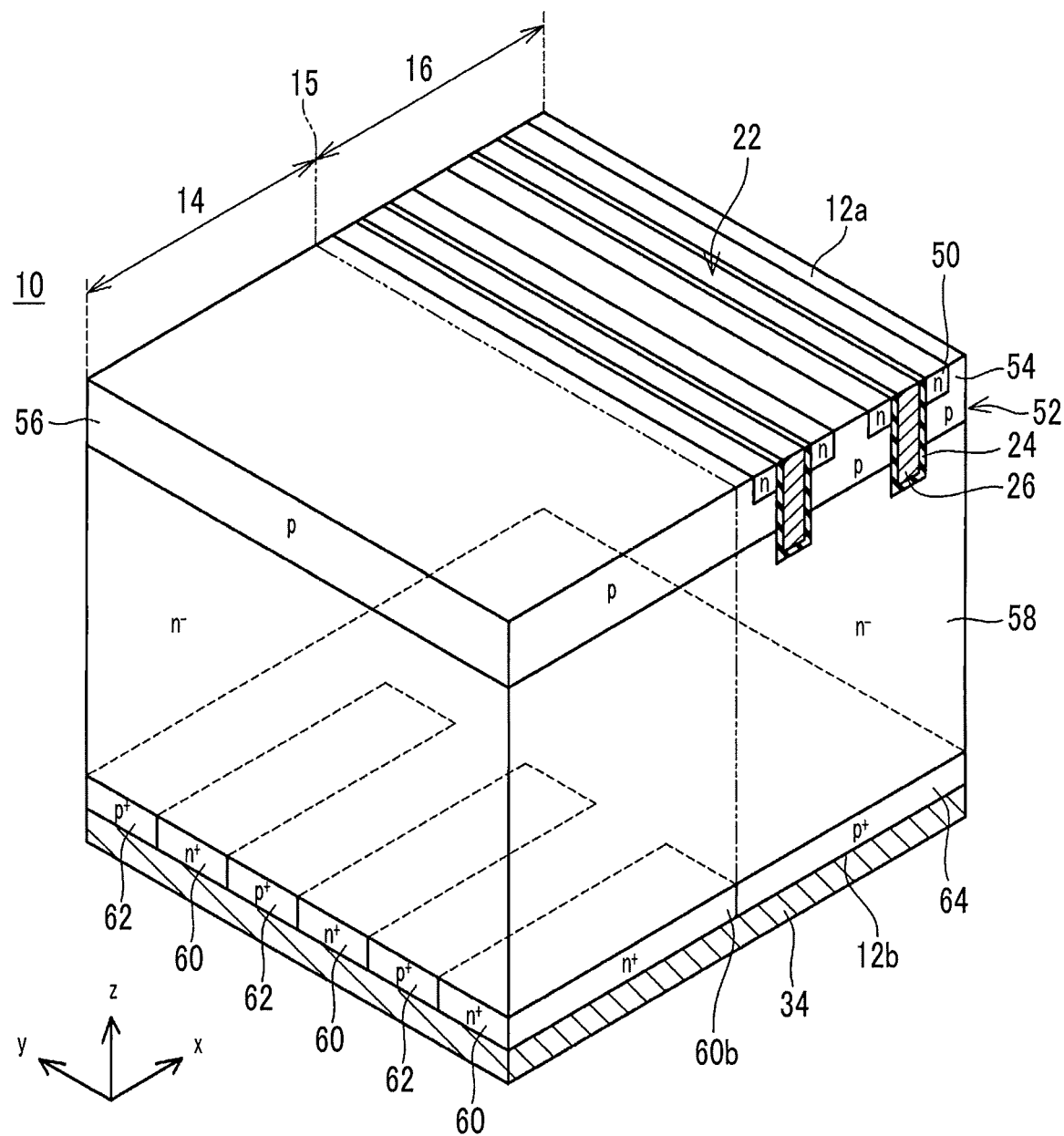
FIG. 3 is a sectional perspective view showing a range III of FIG. 2.
Figure 4:
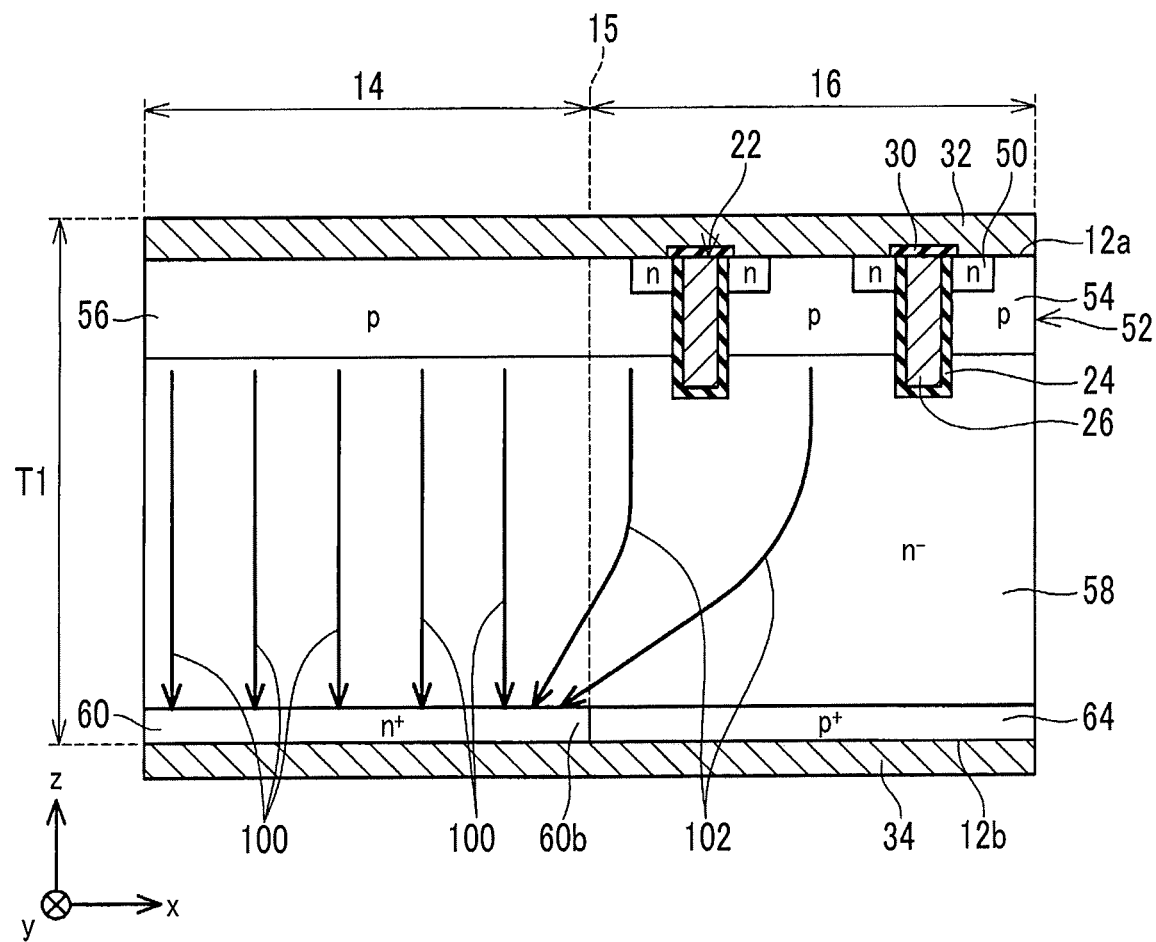
FIG. 4 is a sectional view of a position including the cathode region in the semiconductor apparatus of the example.
Figure 5:
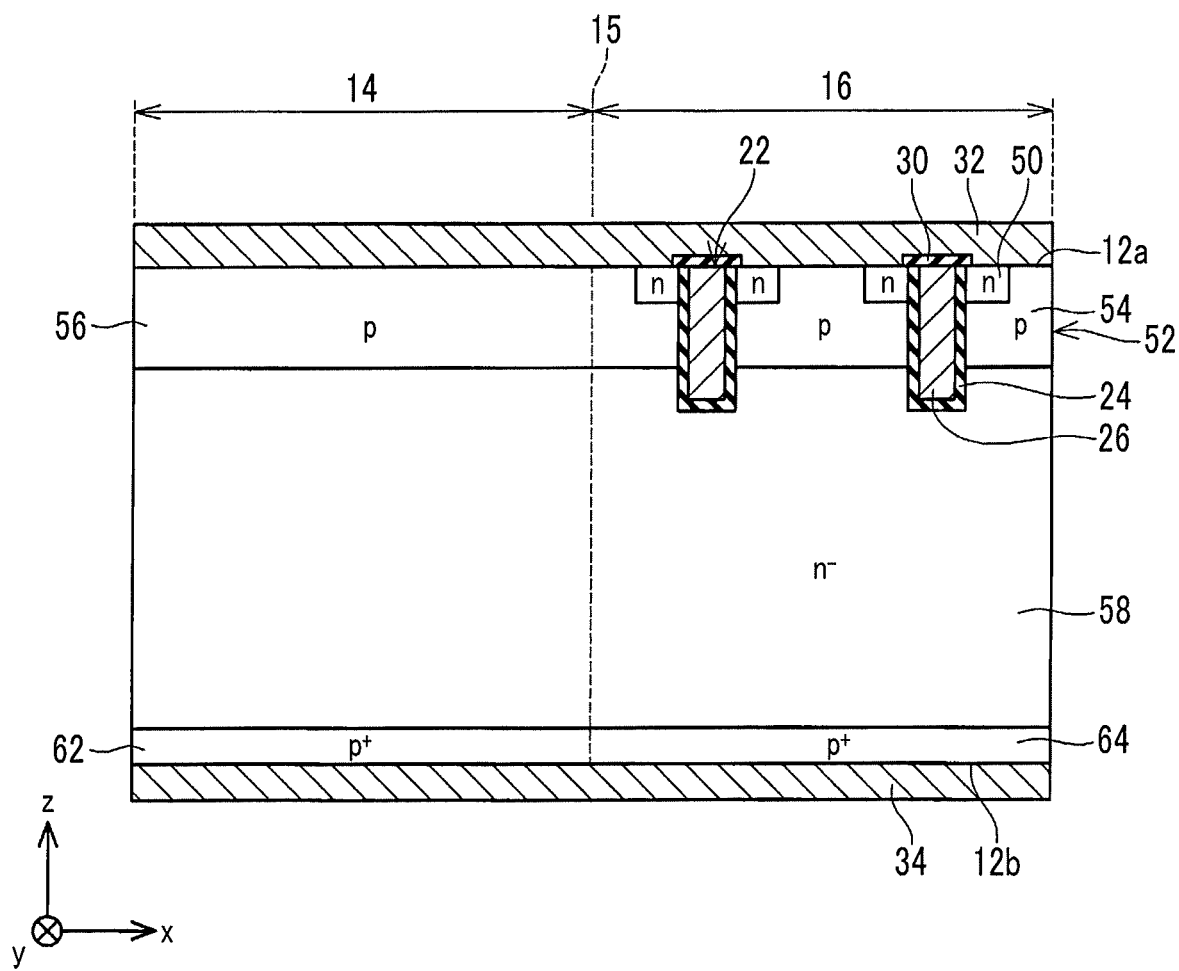
FIG. 5 is a sectional view including a position including the current-limiting region in the semiconductor apparatus of the example.

FIG. 3 is a sectional perspective view in a range III of FIG. 2. FIGS. 4 and 5 are sectional views of the range of FIG. 3 in an xz plane of the semiconductor apparatus 10. FIG. 4 is a sectional view in a cross-section passing through the cathode region 60, and FIG. 5 is a sectional view in a cross-section passing through the current-limiting region 62. As shown in FIGS. 4 and 5, the semiconductor apparatus 10 has an upper electrode 32 and a lower electrode 34. The upper electrode 32 is disposed on the upper surface 12a of the semiconductor substrate 12, and the lower electrode 34 is disposed on the lower surface 12b of the semiconductor substrate 12. In FIG. 3, for convenience of description, the upper electrode 32 is omitted.

As shown in FIGS. 3 to 5, the cathode region 60, the current-limiting region 62, and the collector region 64 are in contact with the lower electrode 34. The cathode region 60, the current-limiting region 62, and the collector region 64 are in ohmic contact with the lower electrode 34.

As shown in FIGS. 3 to 5, the semiconductor substrate 12 has a drift region 58, a body region 52, and an emitter region 50.

The drift region 58 is an n-type region that has an n-type impurity concentration lower than the cathode region 60. The drift region 58 is distributed over the diode range 14 and the IGBT range 16. The drift region 58 is in contact with an upper surface of the cathode region 60, an upper surface of the current-limiting region 62, and an upper surface of the collector region 64.

The body region 52 is a p-type region. The body region 52 is distributed over the diode range 14 and the IGBT range 16. The body region 52 is in contact with an upper surface of the drift region 58. Hereinafter, the body region 52 in the diode range 14 may be referred to as an anode region 56, and the body region 52 in the IGBT range 16 may be referred to as an IGBT body region 54. The body region 52 is exposed to the upper surface 12a of the semiconductor substrate 12 in each of the diode range 14 and the IGBT range 16. The body region 52 has a high p-type impurity concentration in a range of being exposed to the upper surface 12a, and has a low p-type impurity concentration in a range below the range of being exposed to the upper surface 12a (below the emitter region 50). The body region 52 is in ohmic contact with the upper electrode 32 in each of the diode range 14 and the IGBT range 16.

The emitter region 50 is an n-type region that has an n-type impurity concentration higher than the drift region 58. The emitter region 50 is disposed in the IGBT range 16. The emitter region 50 is exposed to the upper surface 12a of the semiconductor substrate 12. The emitter region 50 is in ohmic contact with the upper electrode 32. The body region 52 is disposed below the emitter region 50. The emitter region 50 is separated from the drift region 58 by the body region 52.

In the upper surface 12a of the semiconductor substrate 12, a plurality of trenches 22 is provided. In the upper surface 12a, each trench 22 extends long in the y direction. In the upper surface 12a, the trenches 22 are arranged at intervals in the x direction. The trenches 22 are disposed in the IGBT range 16. Each trench 22 is provided at a position adjacent to the emitter region 50. In the z direction, each trench 22 extends to have a depth passing through the emitter region 50 and the body region 52 from the upper surface 12a and reaching the drift region 58. An inner surface of each trench 22 is covered with a gate insulating film 24. In each trench 22, a gate electrode 26 is disposed. Each gate electrode 26 is insulated from the semiconductor substrate 12 by the gate insulating film 24. Each gate electrode 26 faces the emitter region 50, the IGBT body region 54, and the drift region 58 through the gate insulating film 24. As shown in FIGS. 4 and 5, an upper surface of the gate electrode 26 is covered with an insulating interlayer 30. The gate electrode 26 is insulated from the upper electrode 32 by the insulating interlayer 30.

In the diode range 14, a diode is formed of the anode region 56, the drift region 58, and the cathode region 60. When the semiconductor apparatus 10 operates as a diode, the upper electrode 32 functions as an anode electrode, and the lower electrode 34 functions as a cathode electrode.

In the IGBT range 16, an IGBT is formed of the emitter region 50, the IGBT body region 54, the drift region 58, the collector region 64, the gate electrode 26, and the like. When the semiconductor apparatus 10 operates as the IGBT, the upper electrode 32 functions as an emitter electrode, and the lower electrode 34 functions as a collector electrode.

Next, the operation of the semiconductor apparatus 10 will be described. First, the operation of the IGBT will be described. When the semiconductor apparatus 10 operates as the IGBT, a potential higher than the upper electrode 32 is applied to the lower electrode 34. When the potential of the gate electrode 26 increases to a potential higher than a gate threshold, a channel is formed in the IGBT body region 54 near the gate insulating film 24. The emitter region 50 and the drift region 58 are connected by the channel. For this reason, electrons flow from the upper electrode 32 into the lower electrode 34 through the emitter region 50, the channel, the drift region 58, and the collector region 64. Simultaneously, holes flow from the lower electrode 34 into the upper electrode 32 through the collector region 64, the drift region 58, and the IGBT body region 54. For this reason, a current flows from the lower electrode 34 toward the upper electrode 32. That is, the IGBT is turned on. When the potential of the gate electrode 26 decreases to a potential lower than the gate threshold, the channel vanishes, and the current is stopped. That is, the IGBT is turned off.

Next, the operation of the diode will be described. When a potential higher than the lower electrode 34 is applied to the upper electrode 32, the diode is turned on. That is, as indicated by an arrow 100 of FIG. 4, holes flow from the upper electrode 32 into the lower electrode 34 through the anode region 56, the drift region 58, and the cathode region 60. The holes flow from the drift region 58 into the cathode region 60, whereby electrons are supplied from the cathode region 60 into the drift region 58. Accordingly, electrons flow from the lower electrode 34 into the upper electrode 32 through the cathode region 60, the drift region 58, and the anode region 56. Accordingly, a current flows from the upper electrode 32 toward the lower electrode 34.

As shown in FIG. 5, the current-limiting region 62 is provided in a part of the range of being exposed to the lower surface 12b of the diode range 14. The current-limiting region 62 is a p-type region that has a high p-type impurity concentration. For this reason, the holes that flow in the drift region 58 cannot flow into the current-limiting region 62. Accordingly, when the diode is turned on, a current hardly flows in the current-limiting region 62. Therefore, even in a state in which the diode is turned on, electrons and holes are hardly present in the drift region 58 above the current-limiting region 62. As described above, the current-limiting region 62 is provided, whereby electrons and holes that are present in the drift region 58 are restrained from becoming excessively large.

Figure 6:
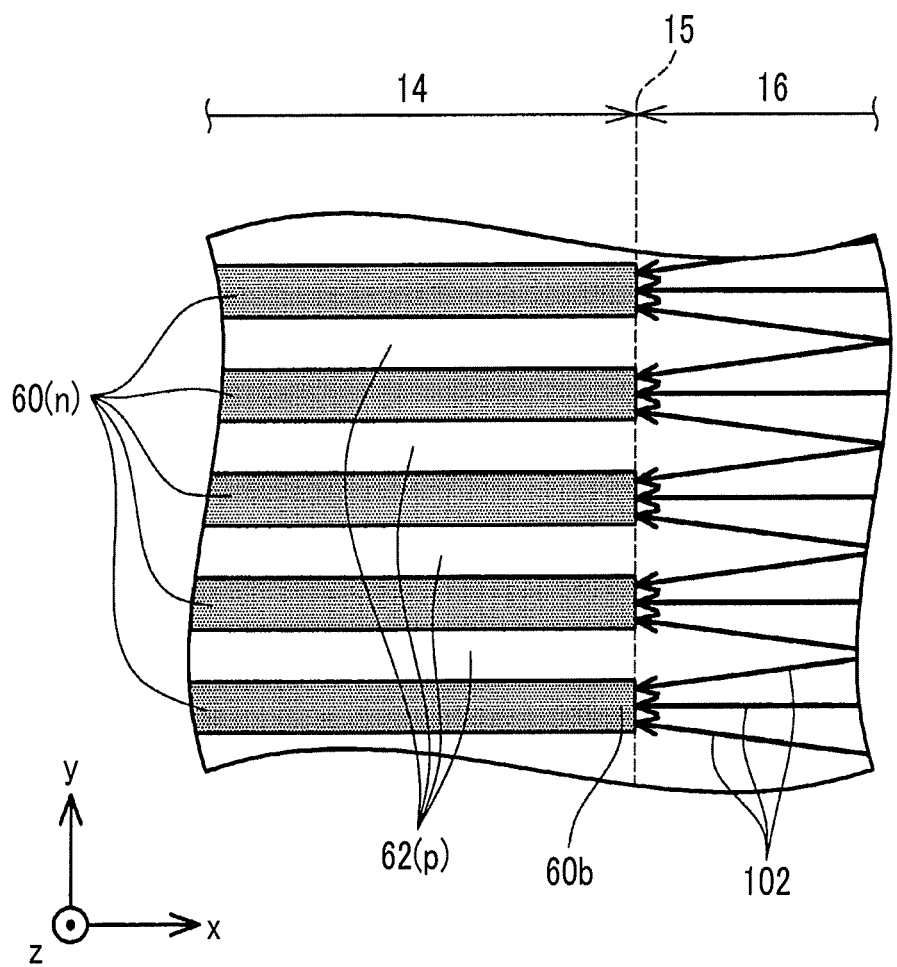
FIG. 6 is a plan view showing a current path between an IGBT range and a diode range in the semiconductor apparatus of the example.

Since the IGBT body region 54 is connected to the upper electrode 32, when the diode is turned on, holes flow from the IGBT body region 54 into the drift region 58. The holes that flow into the drift region 58 flow toward the cathode region 60 as indicated by an arrow 102 of FIG. 4. When the holes flow into the cathode region 60 as indicated by the arrow 102, electrons are supplied from the cathode region 60 into the drift region 58. The electrons supplied into the drift region 58 flow in an opposite direction to the arrow 102 and flow into the upper electrode 32 through the IGBT body region 54. Accordingly, when the diode is turned on, a current flows not only in a path indicated by the arrow 100 but also in a path indicated by the arrow 102. FIG. 6 shows a state in which the current path indicated by the arrow 102 is viewed from the top along the z direction. As shown in FIG. 6, the cathode regions 60 face a boundary 15 between the diode range 14 and the IGBT range 16. For this reason, the current that flows toward the diode range 14 as indicated by the arrow 102 is branched and flows into each cathode region 60. For this reason, the current flows in each cathode region 60 substantially evenly.

In a state in which the diode is turned on, when the potential of the upper electrode 32 decreases to a potential lower than the potential of the lower electrode 34, the diode performs a recovery operation. That is, in the on state of the diode, a plurality of holes and electrons is present in the drift region 58. In the recovery operation, the holes in the drift region 58 are discharged to the upper electrode 32 through the anode region 56, and the electrons in the drift region 58 are discharged to the lower electrode 34 through the cathode region 60. Accordingly, an extremely high reverse current (recovery current) flows in the diode instantaneously. The recovery current is attenuated in a short time, and thereafter, the diode is turned off. In a state in which the recovery current flows, since the potential difference between the upper electrode 32 and the lower electrode 34 is large, a comparatively large loss is generated in the semiconductor substrate 12 when the recovery current flows. For this reason, heat is generated from the semiconductor substrate 12.

However, in the semiconductor apparatus of the embodiment, as described above, the current-limiting region 62 restrains the electrons and the holes that are present in the drift region 58 in the on state of the diode from becoming excessively large. Accordingly, the electrons and the holes that are discharged from the drift region 58 at the time of the recovery operation are not so large. As a result, the recovery current is suppressed. For this reason, an increase in temperature of the semiconductor substrate 12 due to the recovery current is suppressed.

As described above, in the on state of the diode, the current also flows in the path indicated by the arrow 102 of FIGS. 4 and 6. For this reason, electrons and holes are also present in the drift region 58 in the IGBT range 16. In the recovery operation, electrons and holes are also discharged from the drift region 58 in the IGBT range 16. At this time, the holes are discharged to the upper electrode 32 through the IGBT body region 54, and the electrons are discharged to the lower electrode 34 through the cathode region 60. That is, in the recovery operation, the electrons flow along the path indicated by the arrow 102 of FIGS. 4 and 6. As shown in FIG. 6, the cathode regions 60 face the boundary 15 between the diode range 14 and the IGBT range 16. For this reason, the electrons that flow toward the diode range 14 as indicated by the arrow 102 are branched and flow into each cathode region 60. For this reason, the electrons flow in each cathode region 60 substantially evenly. That is, the recovery current flows in each cathode region 60 substantially evenly. Since the recovery current does not concentrate in a specific cathode region 60, an excessive increase in temperature of the specific cathode region 60 is suppressed. A part of the electrons that flow as indicated by the arrow 102 flow into the current-limiting region 62. With this, the electrons that flow into each cathode region 60 become small, and the recovery current that flows in each cathode region 60 is suppressed. Since the length of each cathode region 60 in the x direction is long, the recovery current flows in the x direction in a dispersed manner in each cathode region 60. In particular, since the length L1 of the cathode region 60 in the x direction is longer than the thickness T1 of the semiconductor substrate 12, the recovery current flows in the x direction in a more widely dispersed manner. With this, an increase in temperature of each cathode region 60 is further suppressed. As described above, an increase in temperature of each cathode region 60 in the recovery operation is suppressed.

Figure 7:
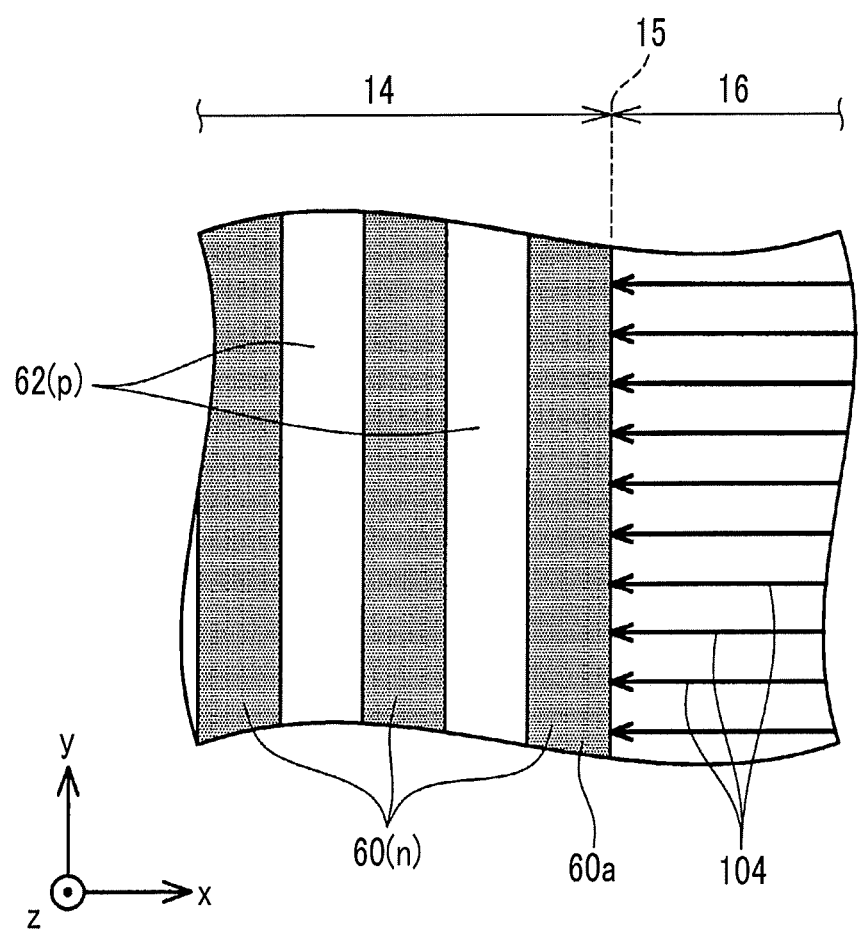
FIG. 7 is a plan view showing a current path between an IGBT range and a diode range in a semiconductor apparatus of a comparative example.

FIG. 7 shows when the cathode regions 60 and the current-limiting regions 62 are alternately arranged in the x direction as a comparative example. In FIG. 7, a cathode region 60a faces the boundary 15 between the diode range 14 and the IGBT range 16, and other cathode regions 60 do not face the boundary 15. For this reason, in the recovery operation, the electrons that are present in the drift region 58 in the IGBT range 16 flow toward the single cathode region 60a as indicated by an arrow 104 of FIG. 7. The electrons that flow from the IGBT range 16 toward the diode range 14 hardly flow into the cathode regions 60 other than the cathode region 60a. That is, the recovery current flows in the cathode region 60a in higher density than other cathode regions 60. For this reason, the cathode region 60a increases to a higher temperature than other cathode regions 60, and the cathode region 60a is deteriorated more rapidly than other cathode regions 60. For this reason, the lifetime of the semiconductor apparatus 10 as a whole is short.

In contrast to the comparative example of FIG. 7, in the semiconductor apparatus 10 of the embodiment shown in FIG. 6, since the recovery current flows in each cathode region 60 substantially evenly, there is no case where solely the specific cathode region 60 extremely increases in temperature. For this reason, there is no case where solely the specific cathode region 60 is deteriorated rapidly. With this, the lifetime of the semiconductor apparatus 10 as a whole is extended.

As described above, in the semiconductor apparatus 10 of the embodiment, since the current-limiting region 62 is provided in the diode range 14, the recovery current is suppressed. In addition, in the semiconductor apparatus 10 of the embodiment, since cathode regions 60 and the current-limiting regions 62 are alternately arranged along the y direction (that is, an extension direction of the boundary 15 between the diode range 14 and the IGBT range 16), it is possible to suppress concentration of the recovery current in the specific cathode region 60. As described above, according to the configuration of the embodiment, it is possible to suppress concentration of the recovery current in the semiconductor apparatus provided with the current-limiting region.

Figure 8:
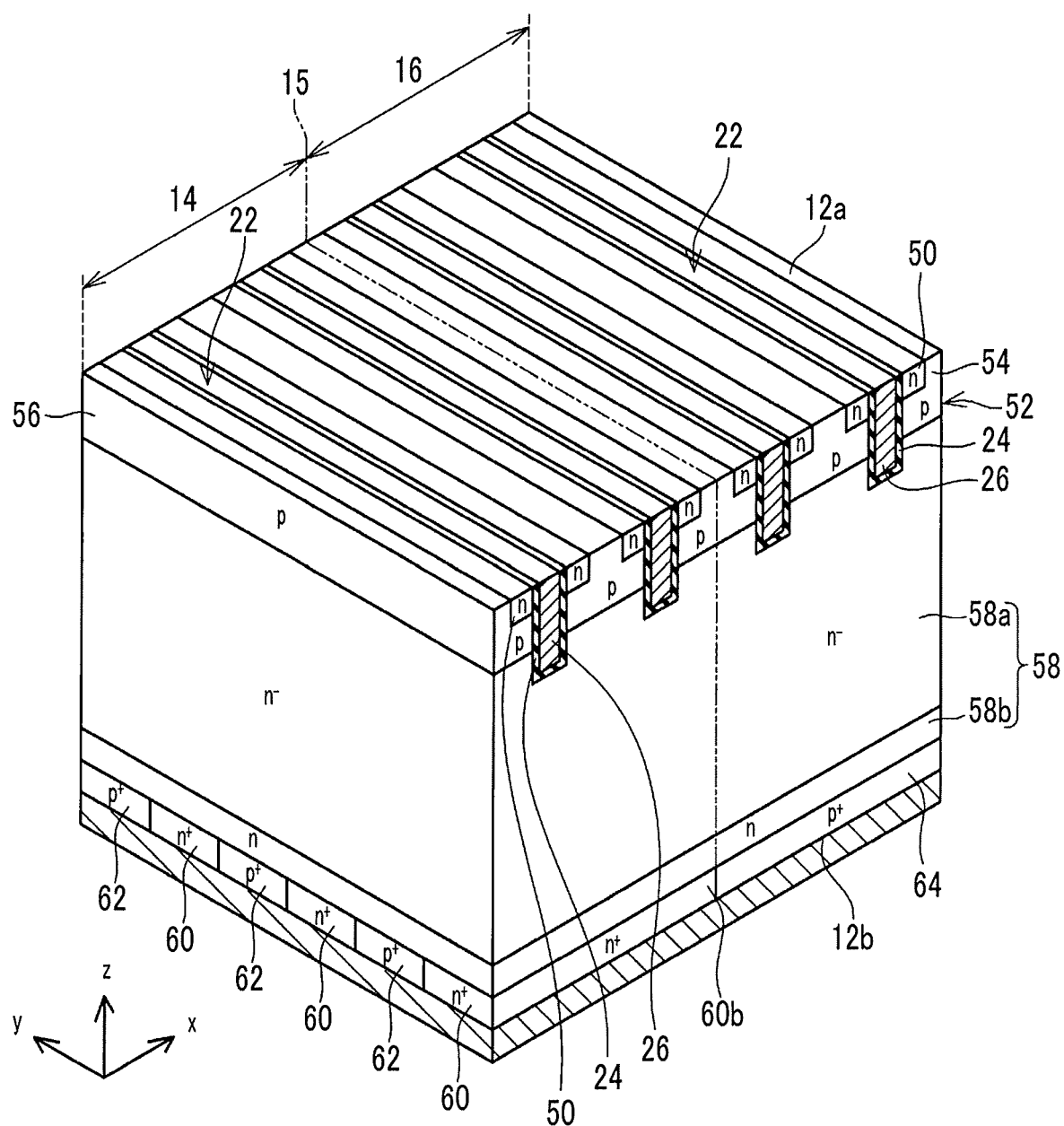
FIG. 8 is a sectional perspective view corresponding to FIG. 3 of the semiconductor apparatus of the example.
Figure 9:
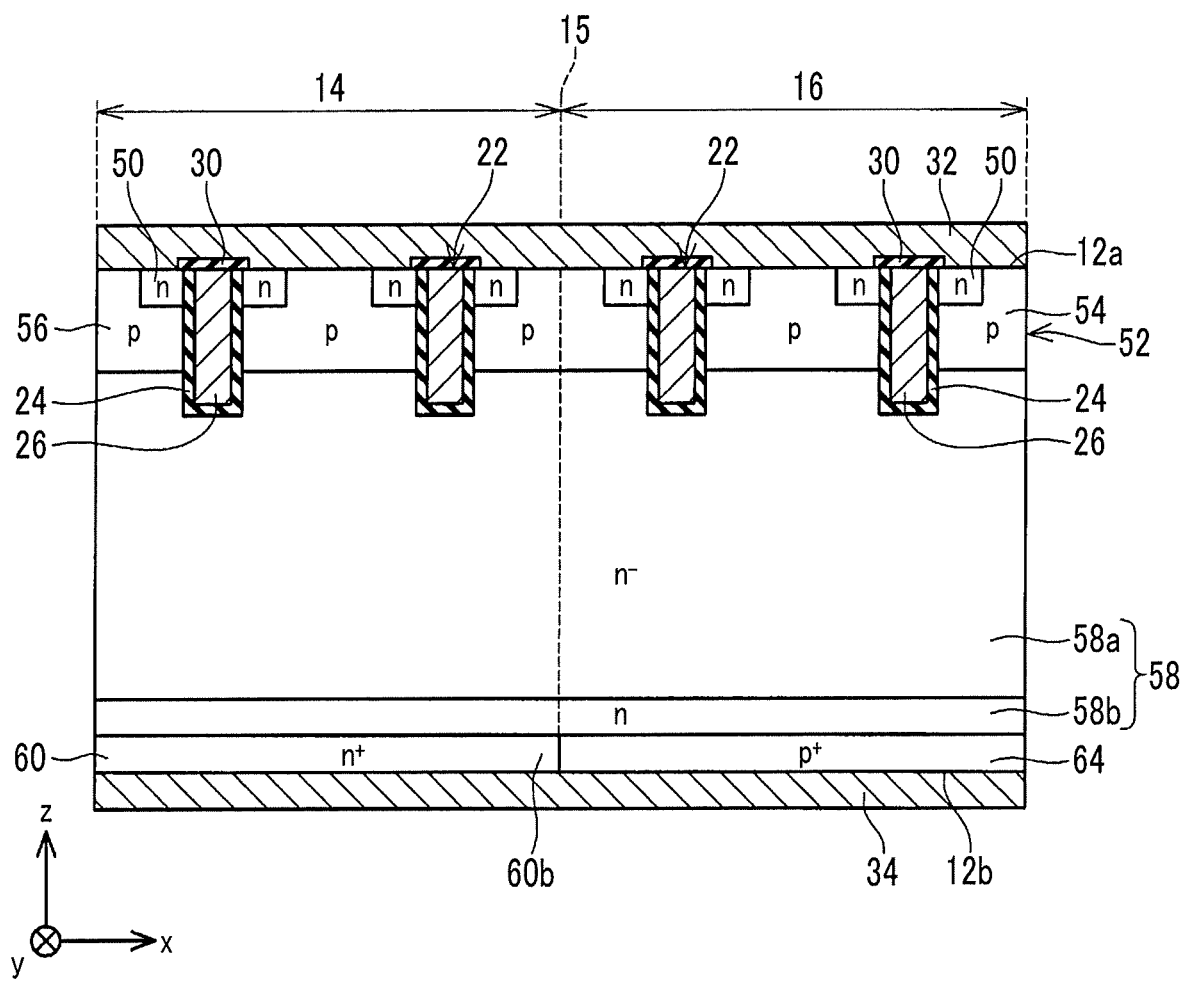
FIG. 9 is a sectional view corresponding to FIG. 4 of the semiconductor apparatus of the example.
Figure 10:
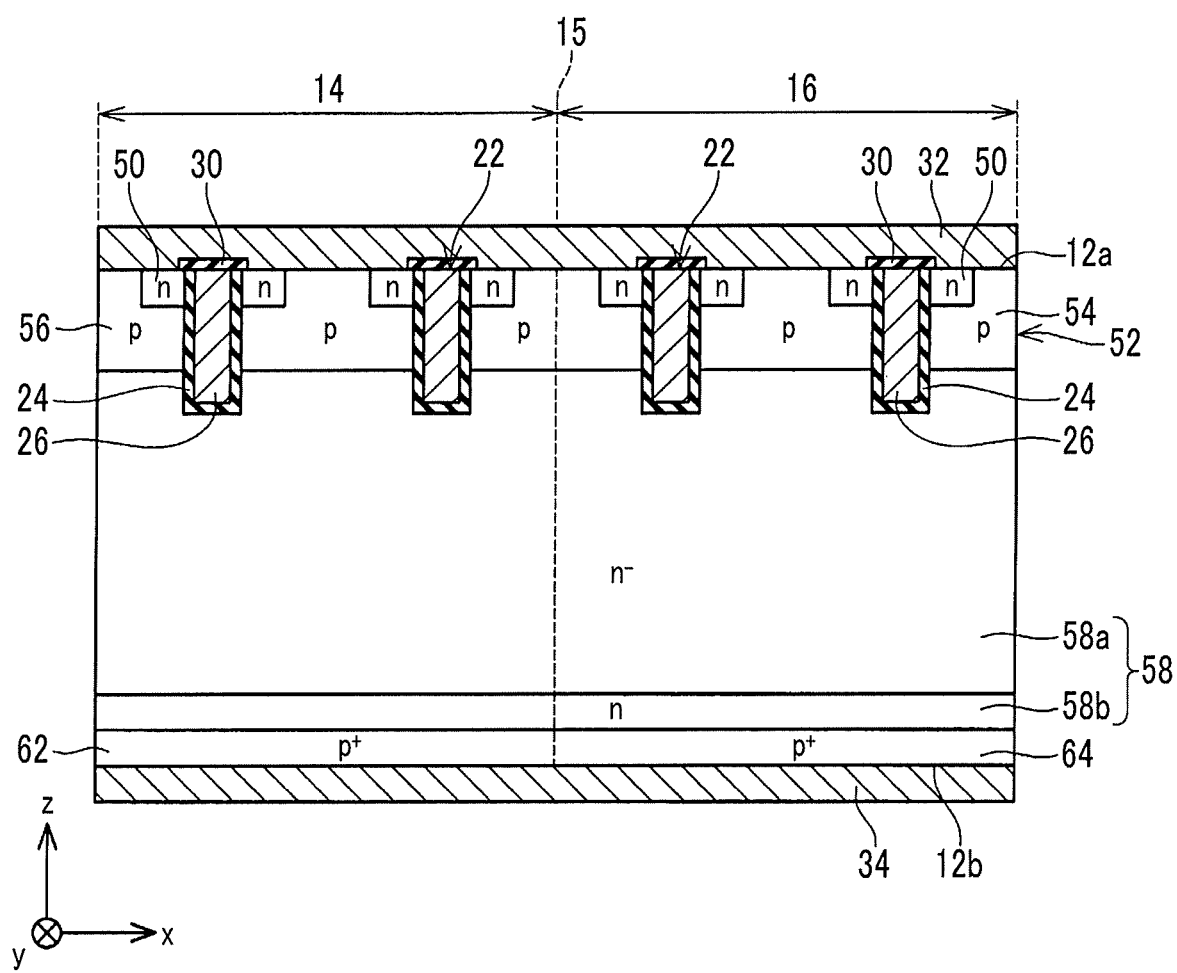
FIG. 10 is a sectional view corresponding to FIG. 5 of the semiconductor apparatus of the example.

FIGS. 8 to 10 show a semiconductor apparatus of Example 2. In the semiconductor apparatus of Example 2, the trench 22, the gate insulating film 24, the gate electrode 26, and the insulating interlayer 30 are also provided in the diode range 14. The configuration of the trench 22, the gate insulating film 24, the gate electrode 26, and the insulating interlayer 30 in the diode range 14 is the same as the configuration of the trench 22, the gate insulating film 24, the gate electrode 26, and the insulating interlayer 30 in the IGBT range 16. The gate electrode 26 in the diode range 14 may be controlled to a potential (for example, the same fixed potential as that of the upper electrode 32) different from the gate electrode 26 in the IGBT range 16. Even though the trench 22, the gate insulating film 24, the gate electrode 26, and the insulating interlayer 30 are provided in the diode range 14, the diode in the diode range 14 operates in the same manner as in Example 1 (in the present disclosure, "same" includes a meaning of "substantially same").

In the semiconductor apparatus of Example 2, the drift region 58 has a low concentration region 58a and a buffer region 58b. An n-type impurity concentration of the buffer region 58b is lower than an n-type impurity concentration of the cathode region 60, and is higher than an n-type impurity concentration of the low concentration region 58a. The buffer region 58b is in contact with the upper surface of the collector region 64, the upper surface of the cathode region 60, and the upper surface of the current-limiting region 62. The low concentration region 58a is in contact with an upper surface of the buffer region 58b and a lower surface of the body region 52. The thickness of the buffer region 58b is much smaller than the thickness of the low concentration region 58a. As described above, even though the buffer region 58b is provided, the diode and the IGBT operate in the same manner as in Example 1 described above.

Next, a semiconductor apparatus of Example 3 will be described. In the semiconductor apparatus of Example 1, as indicated by the arrow 102 of FIG. 6, the recovery current flows in each cathode region 60 in a dispersed manner. Meanwhile, in each cathode region 60, the density of the recovery current becomes higher in an end portion 60b close to the IGBT range 16 than in a portion away from the IGBT range 16. In contrast to Example 1, in Example 3, a configuration in which concentration of the recovery current in the end portion 60b is suppressed is suggested.

FIGS. 11 to 14 show the semiconductor apparatus of Example 3. In the semiconductor apparatus of Example 3, as in the semiconductor apparatus of Example 2, the trench 22, the gate insulating film 24, the gate electrode 26, and the insulating interlayer 30 are also provided in the diode range 14. However, in Example 3, the trench 22, the gate insulating film 24, the gate electrode 26, and the insulating interlayer 30 may not be provided in the diode range 14.

Figure 11:
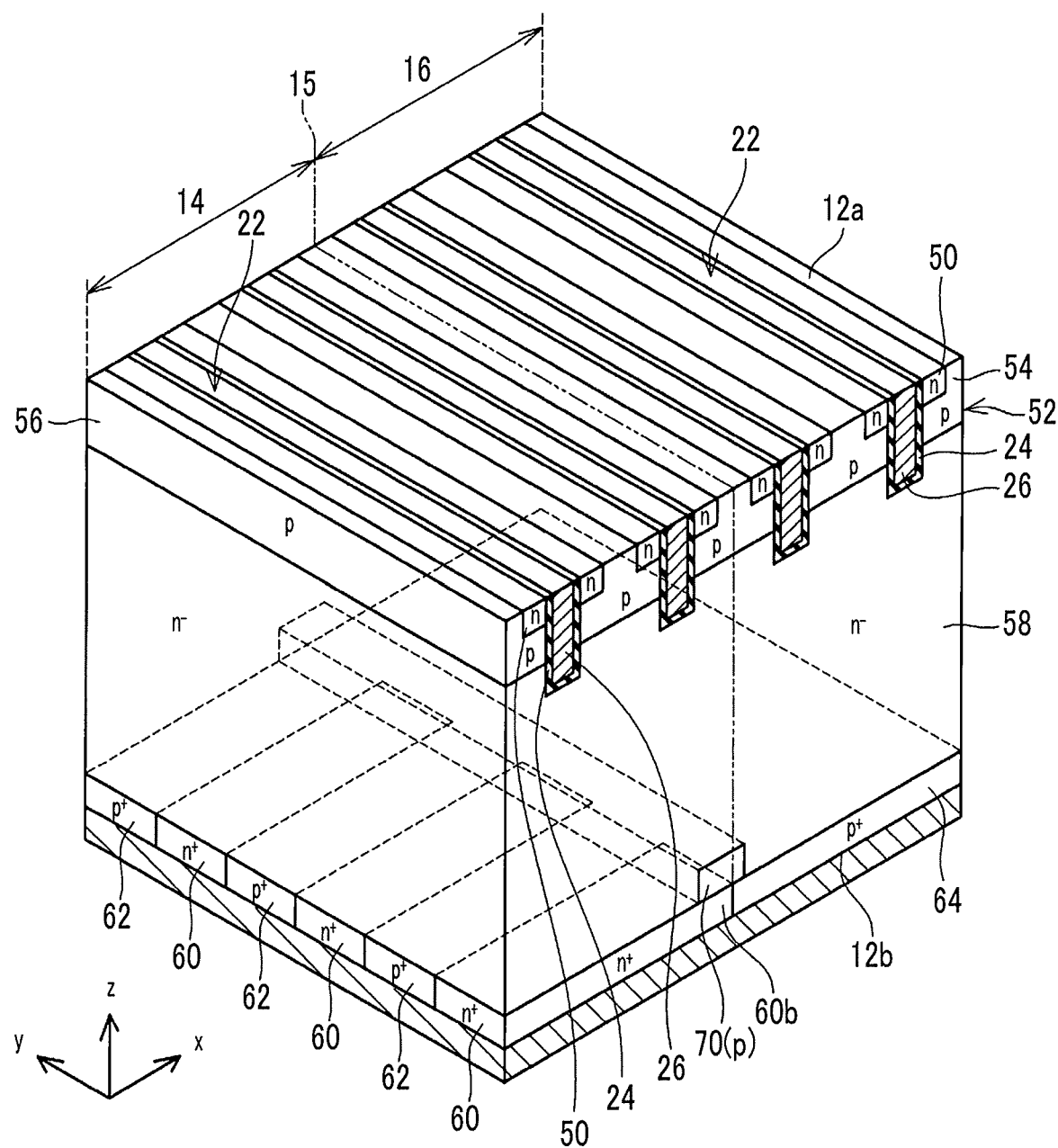
FIG. 11 is a sectional perspective view corresponding to FIG. 3 of the semiconductor apparatus of the example.
Figure 12:
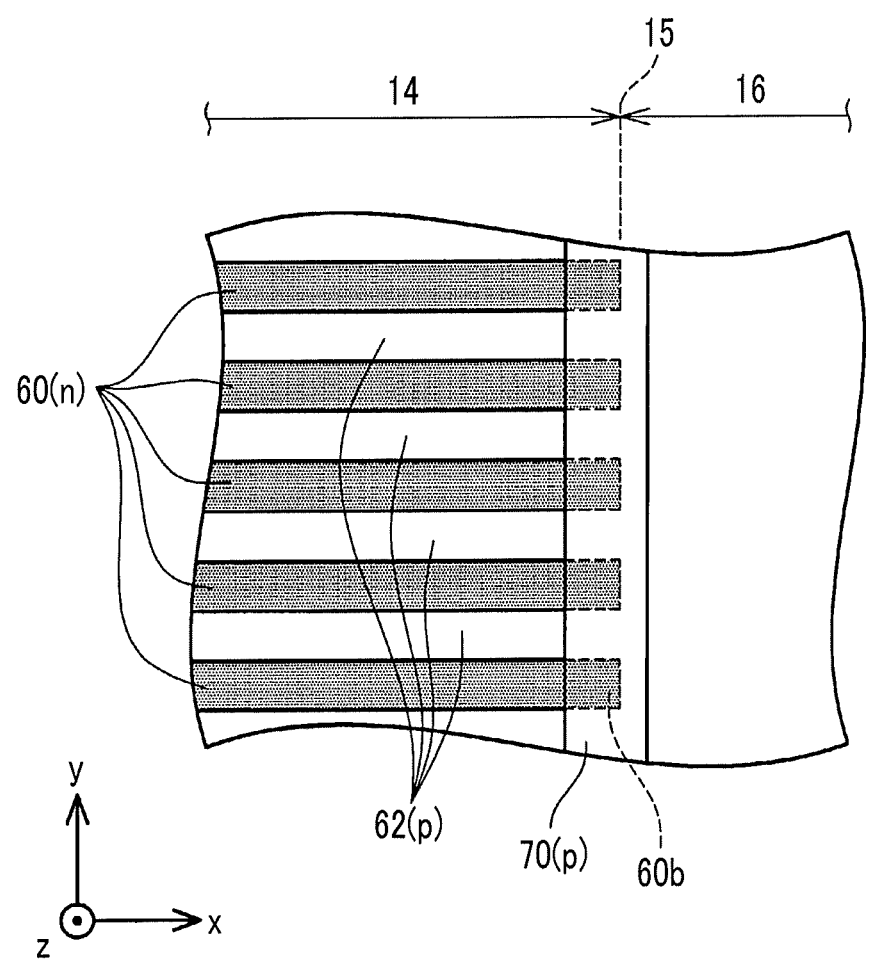
FIG. 12 is a plan view corresponding to FIG. 6 of the semiconductor apparatus of the example.
Figure 13:
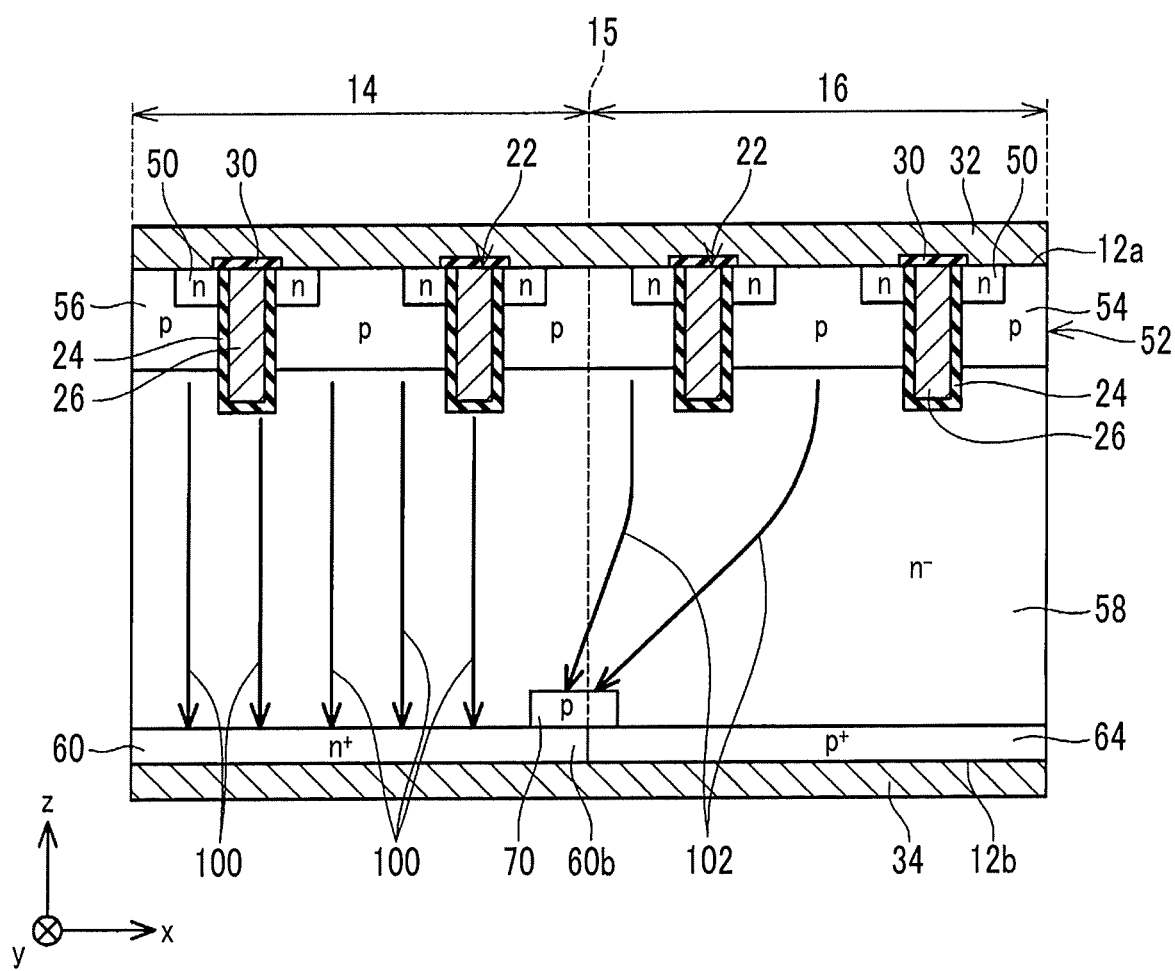
FIG. 13 is a sectional view corresponding to FIG. 4 of the semiconductor apparatus of the example.

In the semiconductor apparatus of Example 3, the semiconductor substrate 12 has a p-type hole blocking region 70. A p-type impurity concentration of the hole blocking region 70 is lower than the n-type impurity concentration of the cathode region 60, the p-type impurity concentration of the current-limiting region 62, and the p-type impurity concentration of the collector region 64. As shown in FIGS. 11 and 12, the hole blocking region 70 is disposed above the cathode region 60, the current-limiting region 62, and the collector region 64, and extends long along the y direction. The hole blocking region 70 is positioned at the boundary 15 between the diode range 14 and the IGBT range 16, and extends along the boundary 15. The hole blocking region 70 extends to both ends (both ends in the y direction) of the element region 11 along the boundary 15. The hole blocking region 70 is in contact with the upper surfaces of each cathode region 60, each current-limiting region 62, and the collector region 64 in the vicinity of the boundary 15. Accordingly, an upper surface of the end portion 60b of each cathode region 60 on the IGBT range 16 side is covered with the hole blocking region 70. The drift region 58 is in contact with an upper surface and a side surface of the hole blocking region 70. In a range in which the hole blocking region 70 is not present, the drift region 58 is in contact with the upper surfaces of the cathode region 60 and the current-limiting region 62.

Figure 14:
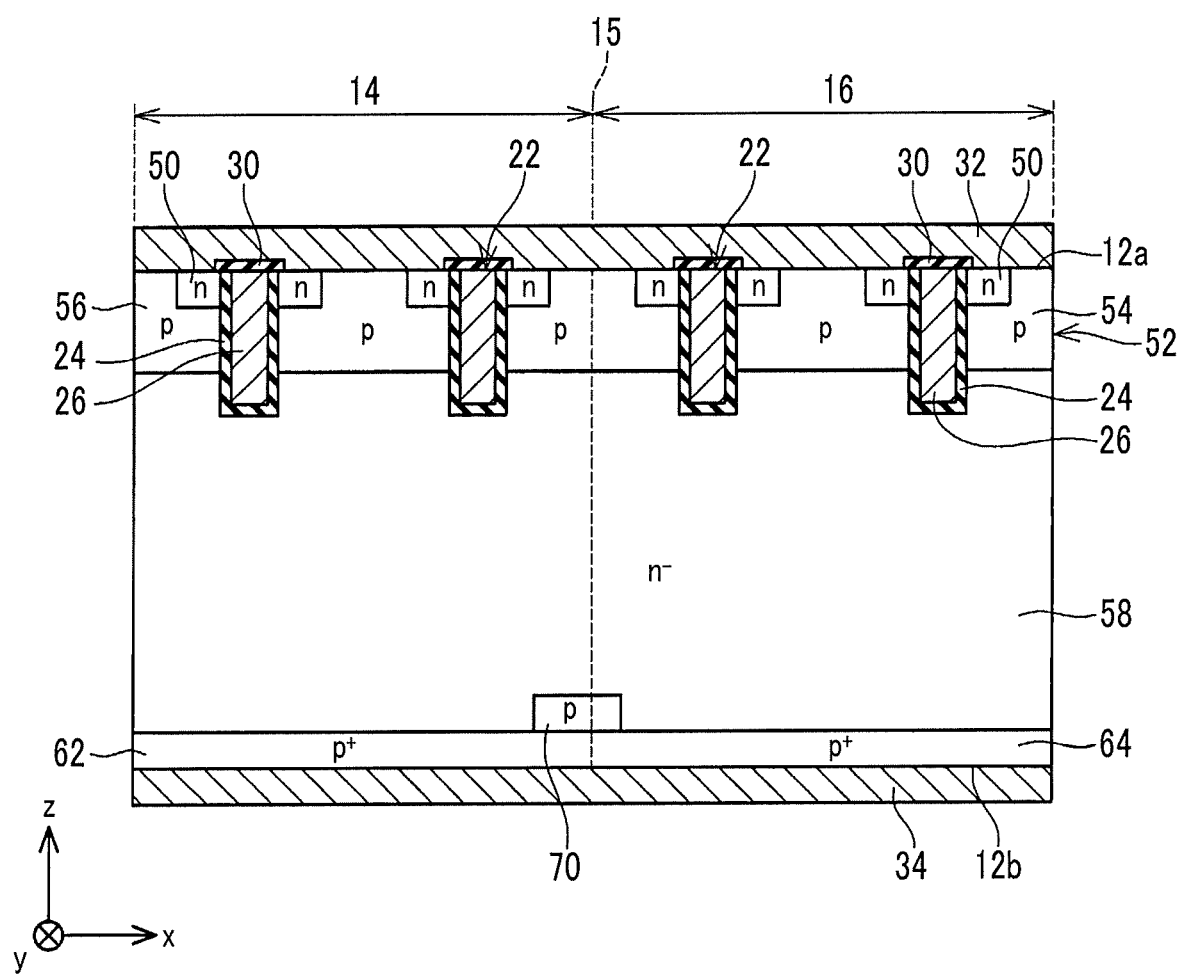
FIG. 14 is a sectional view corresponding to FIG. 5 of the semiconductor apparatus of the example.
Figure 15:
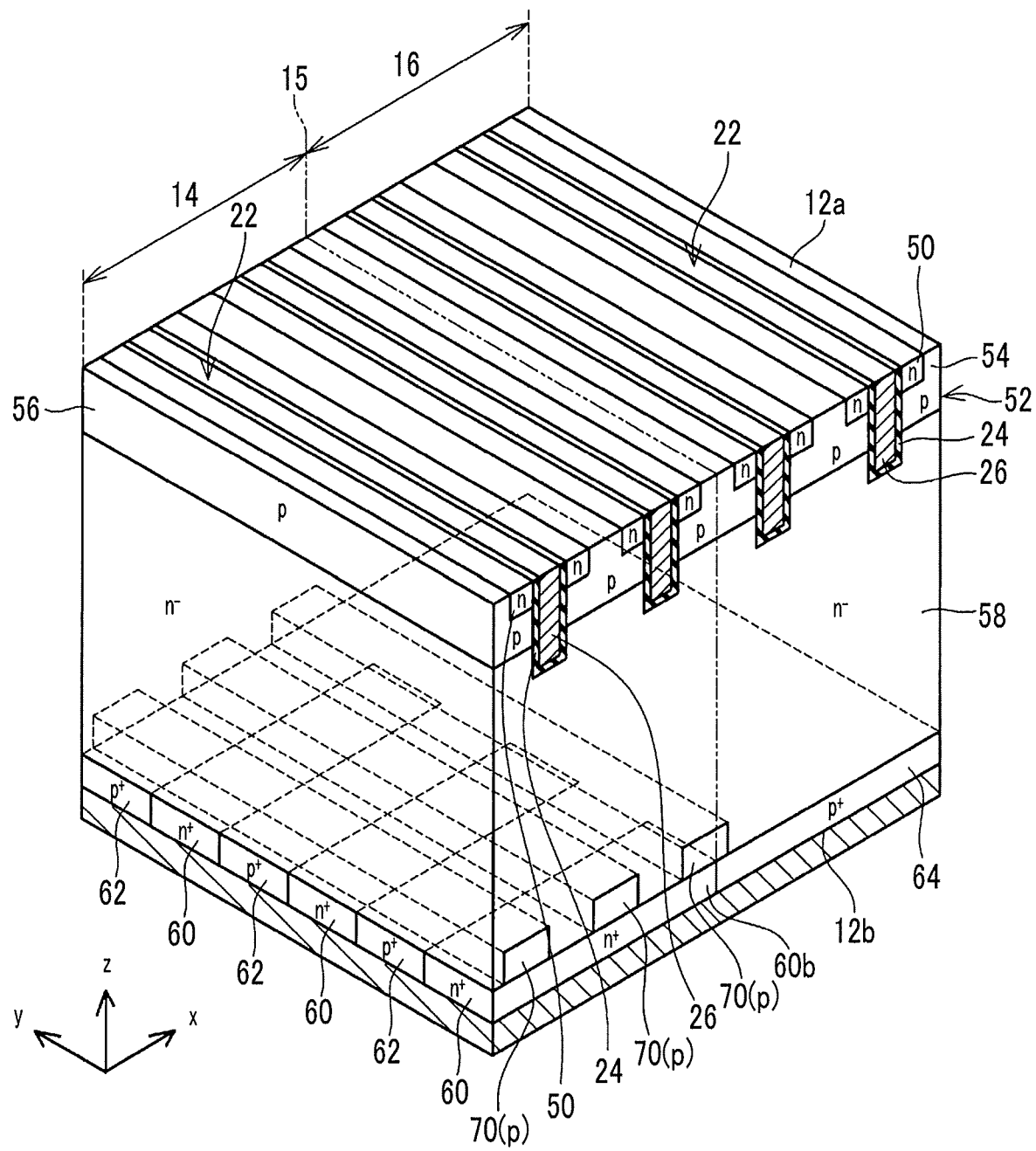
FIG. 15 is a sectional perspective view corresponding to FIG. 3 of the semiconductor apparatus of the example.
Figure 16:
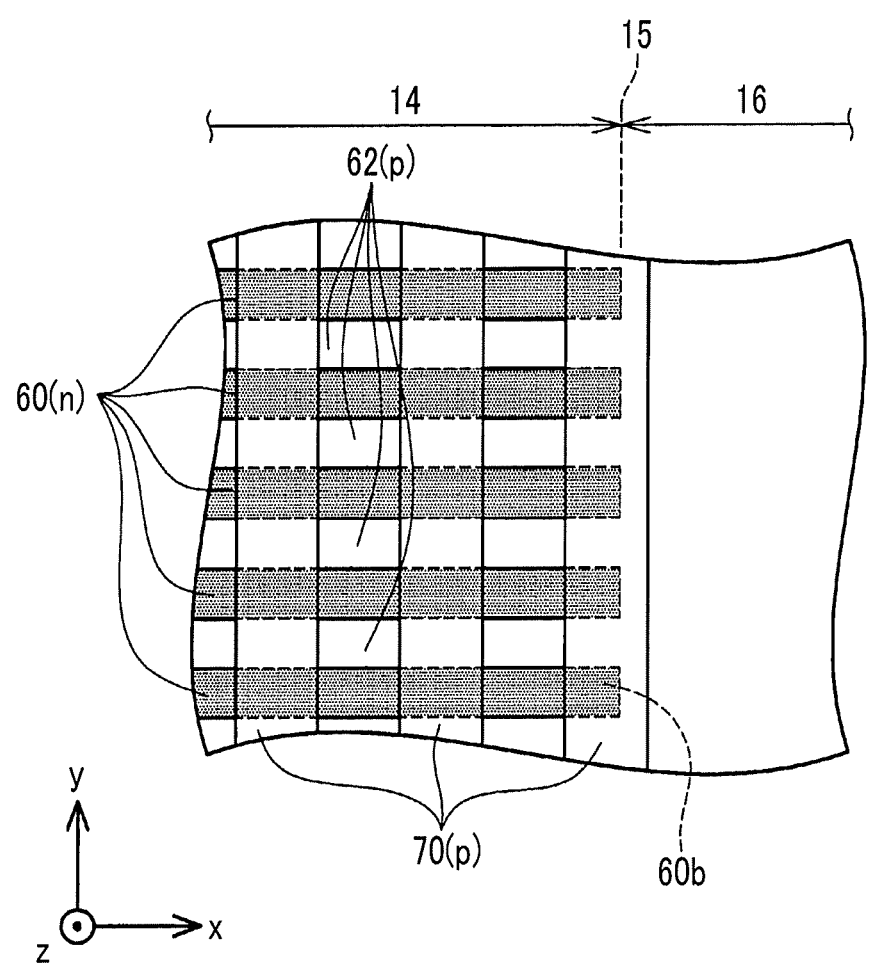
FIG. 16 is a plan view corresponding to FIG. 6 of the semiconductor apparatus of the example.

In the semiconductor apparatus of Example 3, the IGBT operates in the same manner as in Example 1. Furthermore, in the semiconductor apparatus of Example 3, when the diode is turned on, as the arrows 100, 102 of FIG. 4, the holes flow as indicated by the arrows 100, 102 of FIG. 13. As indicated by the arrow 102 of FIG. 13, the holes that flow from the drift region 58 in the IGBT range 16 toward the end portion 60b of the cathode region 60 reach the hole blocking region 70. Since the p-type impurity concentration of the hole blocking region 70 is low, a barrier of an interface between the hole blocking region 70 and the drift region 58 is not so high. For this reason, most of the holes that flow as indicated by the arrow 102 flow into the hole blocking region 70. As shown in FIG. 14, the hole blocking region 70 is connected to the lower electrode 34 through the current-limiting region 62. For this reason, the holes that flow into the hole blocking region 70 flow into the lower electrode 34 through the current-limiting region 62. Therefore, most of the holes that flow in the drift region 58 as indicated by the arrow 102 do not flow into the cathode region 60, and flow into the lower electrode 34 around the cathode region 60. That is, the hole blocking region 70 restrains the holes from flowing into the end portion 60b of the cathode region 60. For this reason, in the semiconductor apparatus of Example 3, in the on state of the diode, the current that flows from the drift region 58 in the IGBT range 16 into the end portion 60b of the cathode region 60 is small. Therefore, in the recovery operation of the diode, the electrons that flow into the end portion 60b of the cathode region 60 are small. That is, the recovery current that flows in the end portion 60b of the cathode region 60 is small. With this, it is possible to suppress concentration of the recovery current in the end portion 60b of the cathode region 60. That is, according to the configuration of Example 3, it is possible to suppress the recovery current that flows in the path indicated by the arrow 102.

FIGS. 15 to 18 show a semiconductor apparatus of Example 4. In the semiconductor apparatus of Example 4, as in the semiconductor apparatus of Example 2, the trench 22, the gate insulating film 24, the gate electrode 26, and the insulating interlayer 30 are also provided in the diode range 14. However, in Example 4, the trench 22, the gate insulating film 24, the gate electrode 26, and the insulating interlayer 30 may not be provided in the diode range 14.

In the semiconductor apparatus of Example 4, a plurality of hole blocking regions 70 is provided in the diode range 14. Each hole blocking region 70 extends long in a linear shape along the y direction as in Example 3, and is in contact with the upper surface of each cathode region 60 and the upper surface of each current-limiting region 62. The hole blocking regions 70 are arranged at intervals in the x direction. The hole blocking region 70 most on the IGBT range 16 side is disposed at the boundary 15. The drift region 58 is in contact with an upper surface and a side surface of each hole blocking region 70. In a range in which the hole blocking region 70 is not present, the drift region 58 is in contact with the upper surfaces of the cathode region 60 and the current-limiting region 62.

Figure 17:
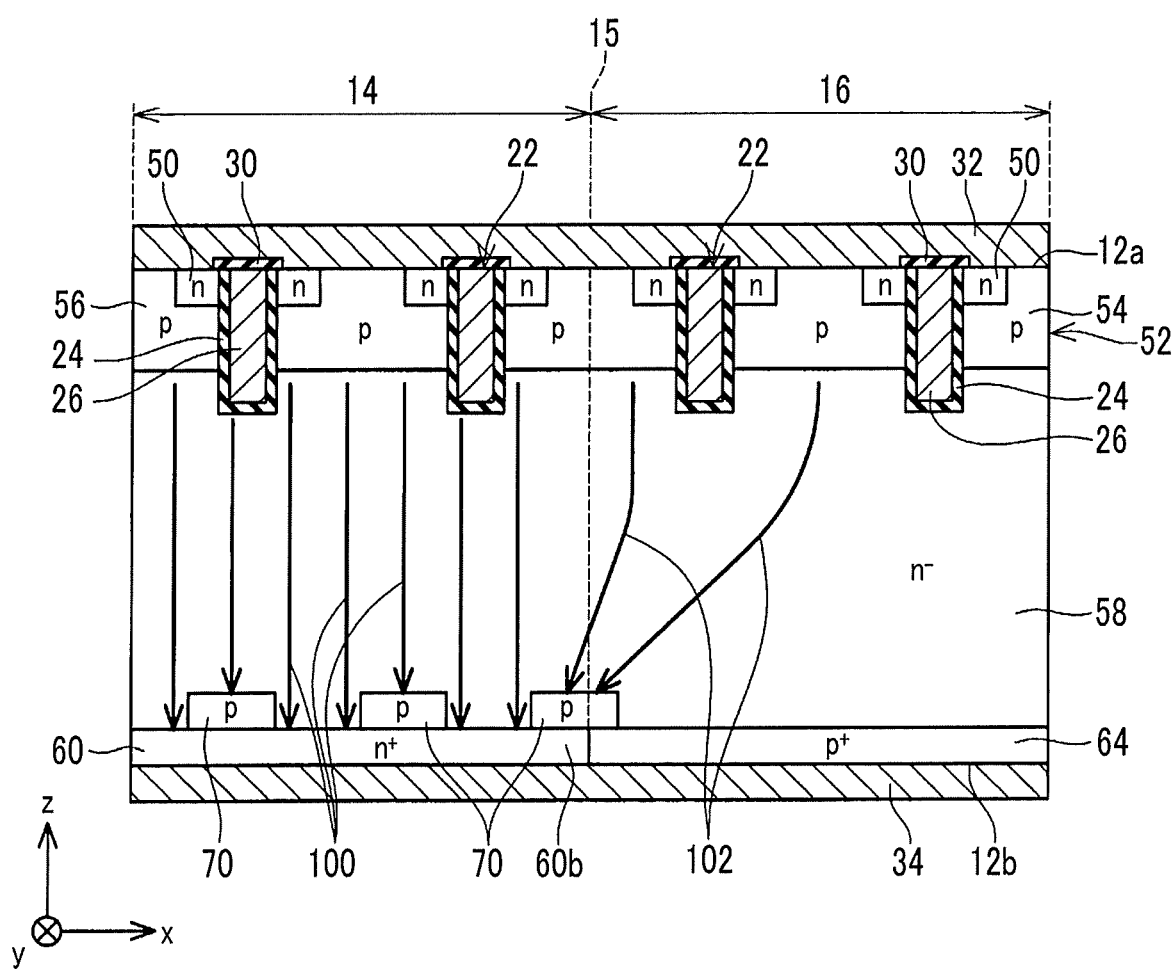
FIG. 17 is a sectional view corresponding to FIG. 4 of the semiconductor apparatus of the example.
Figure 18:
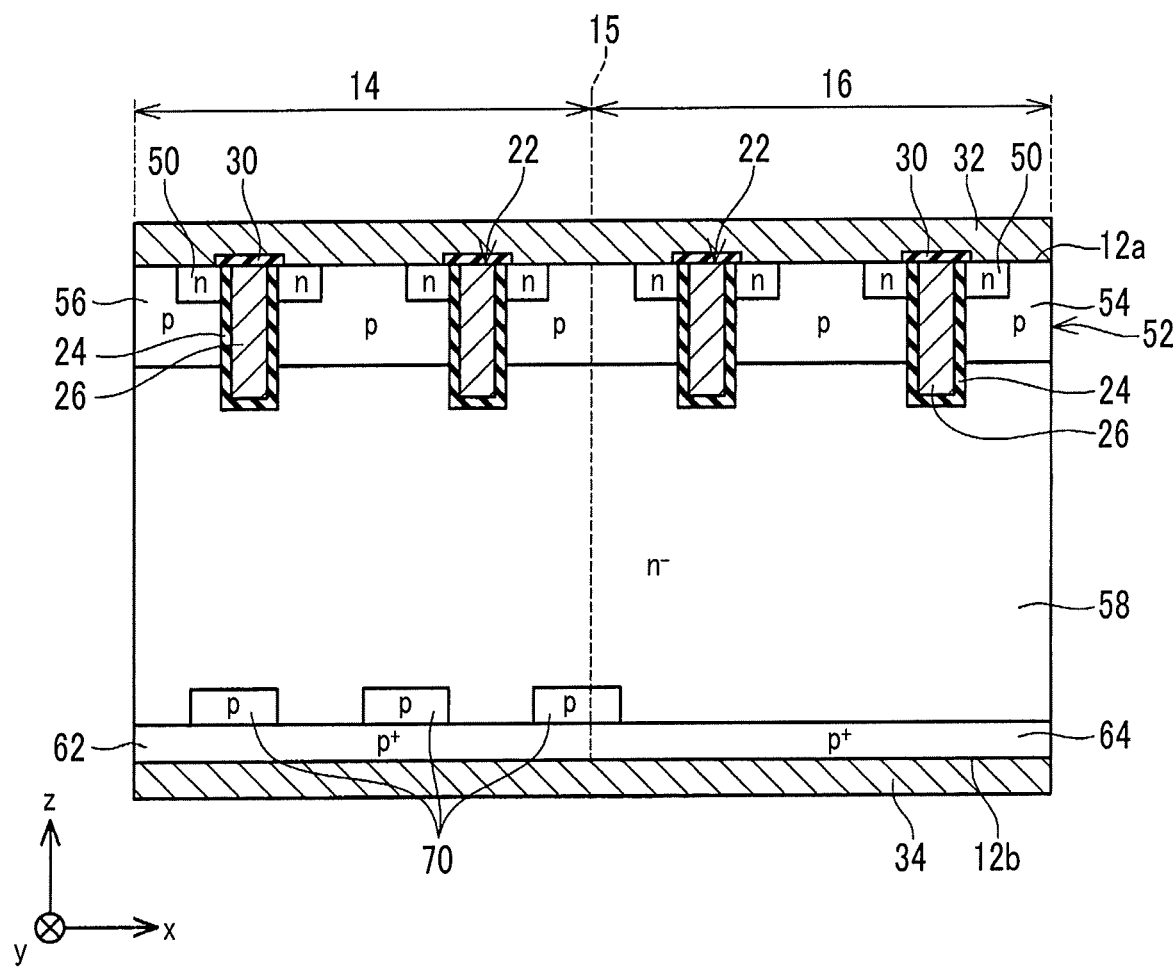
FIG. 18 is a sectional view corresponding to FIG. 5 of the semiconductor apparatus of the example.

In the semiconductor apparatus of Example 4, when the diode is turned on, a part of the holes that flow toward the lower electrode 34 as indicated by the arrow 100 of FIG. 17 flow into each hole blocking region 70. The holes that flow into the hole blocking region 70 flows into the lower electrode 34 through the current-limiting region 62. For this reason, the holes that flow into the cathode region 60 are small. Accordingly, the electrons that flow from the cathode region 60 into the drift region 58 are small. For this reason, in the semiconductor apparatus of Example 4, the electrons (that is, the recovery current) that flow from the drift region 58 into the cathode region 60 at the time of the recovery operation are small. As described above, the hole blocking region 70 is provided at a position other than the boundary 15 in the diode range 14, whereby it is possible to suppress the recovery current not only in the vicinity of the boundary 15 but also in the diode range 14 as a whole.

Figure 19:
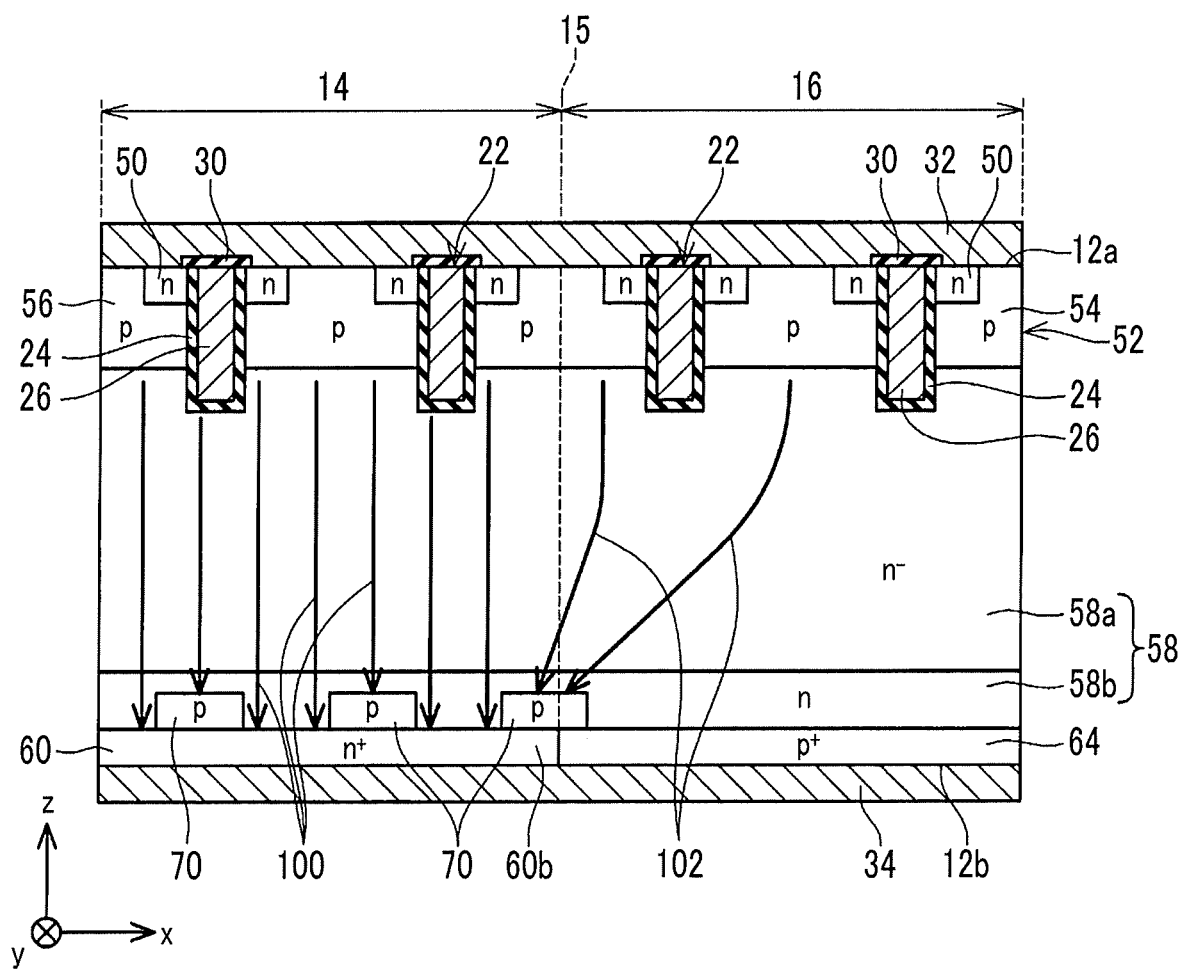
FIG. 19 is a sectional view corresponding to FIG. 4 of the semiconductor apparatus of the example.
Figure 20:
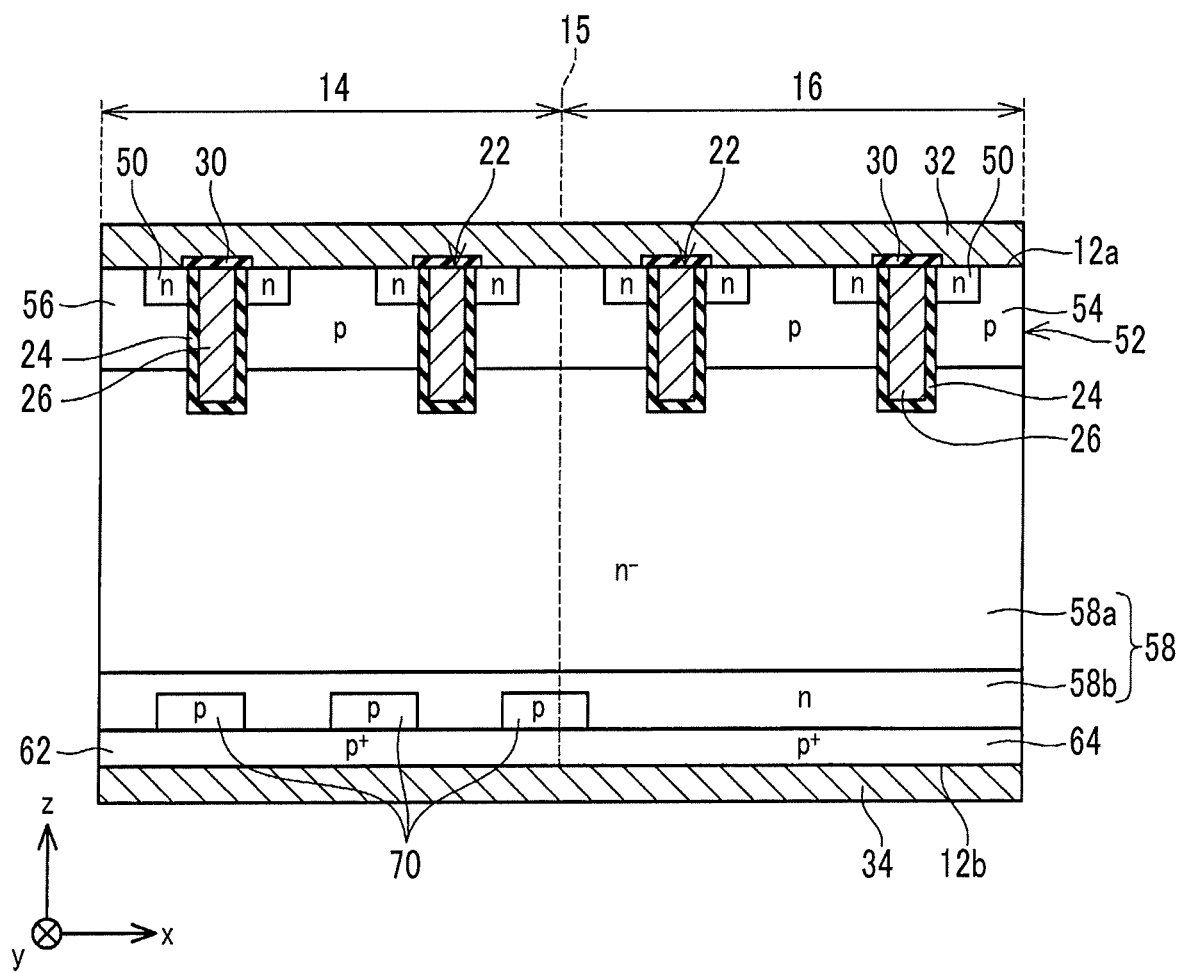
FIG. 20 is a sectional view corresponding to FIG. 5 of the semiconductor apparatus of the example.

FIGS. 19 and 20 show a semiconductor apparatus of Example 5. In the semiconductor apparatus of Example 5, as in the semiconductor apparatus of Example 2, the trench 22, the gate insulating film 24, the gate electrode 26, and the insulating interlayer 30 are also provided in the diode range 14. However, in Example 5, the trench 22, the gate insulating film 24, the gate electrode 26, and the insulating interlayer 30 may not be provided in the diode range 14.

In the semiconductor apparatus of Example 5, as in the semiconductor apparatus of Example 2, the drift region 58 has the low concentration region 58a and the buffer region 58b. Other configurations of the semiconductor apparatus of Example 5 are the same as those of the semiconductor apparatus of Example 4. The n-type impurity concentration of the buffer region 58b is lower than the n-type impurity concentration of the cathode region 60, and is higher than the n-type impurity concentration of the low concentration region 58a. The p-type impurity concentration of the hole blocking region 70 is lower than the n-type impurity concentration of the buffer region 58b. The low concentration region 58a has the same n-type impurity concentration as that of the drift region 58 of Examples 1 to 4 (in the present disclosure, "same" includes a meaning of "substantially same"). The buffer region 58b is provided in a lower end portion of the drift region 58. The buffer region 58b is in contact with the upper surface of the cathode region 60, the upper surface of the current-limiting region 62, the upper surface of the collector region 64, and the upper surface and the side surface of the hole blocking region 70. The low concentration region 58a is provided above the buffer region 58b. The low concentration region 58a is in contact with the upper surface of the buffer region 58b and the lower surface of the body region 52. The thickness of the low concentration region 58a is much greater than the thickness of the buffer region 58b. As described above, even though the buffer region 58b is provided in the semiconductor apparatus having the hole blocking region 70, as in Examples 3, 4, it is possible to suppress the recovery current with the hole blocking region 70.

In Examples 3 to 5, although the hole blocking region 70 is in contact with the current-limiting region 62, the hole blocking region 70 may not be in contact with the current-limiting region 62. In the configuration described above, it is possible to suppress flowing of holes into the cathode region 60 with the hole blocking region 70 to some extent. However, since holes easily flow into the hole blocking region 70 when the hole blocking region 70 is in contact with the current-limiting region 62, it is possible to more effectively suppress flowing of holes into the cathode region 60.

In Examples 3 to 5, although the hole blocking region 70 is provided at the boundary 15, the hole blocking region 70 may not necessarily be provided at the boundary 15. That is, the hole blocking region 70 may be provided solely at a position other than the boundary 15.

In Examples 3 to 5, although the hole blocking region 70 covers a part of the upper surface of the cathode region 60, the hole blocking region 70 may cover the entire upper surface of the cathode region 60. In the configuration described above, since a part of the holes that flow into the hole blocking region 70 flow into the cathode region 60, the semiconductor apparatus can operate as the diode. However, when the hole blocking region 70 covers the entire upper surface of the cathode region 60, the current that flows in the on state of the diode may be suppressed more than needed, and a loss that occurs in the on state may become high. Accordingly, as in Examples 3 to 5, the hole blocking region 70 desirably covers a part of the upper surface of the cathode region 60 (that is, another part of the upper surface of the cathode region 60 is in contact with the drift region 58).

Figure 21:
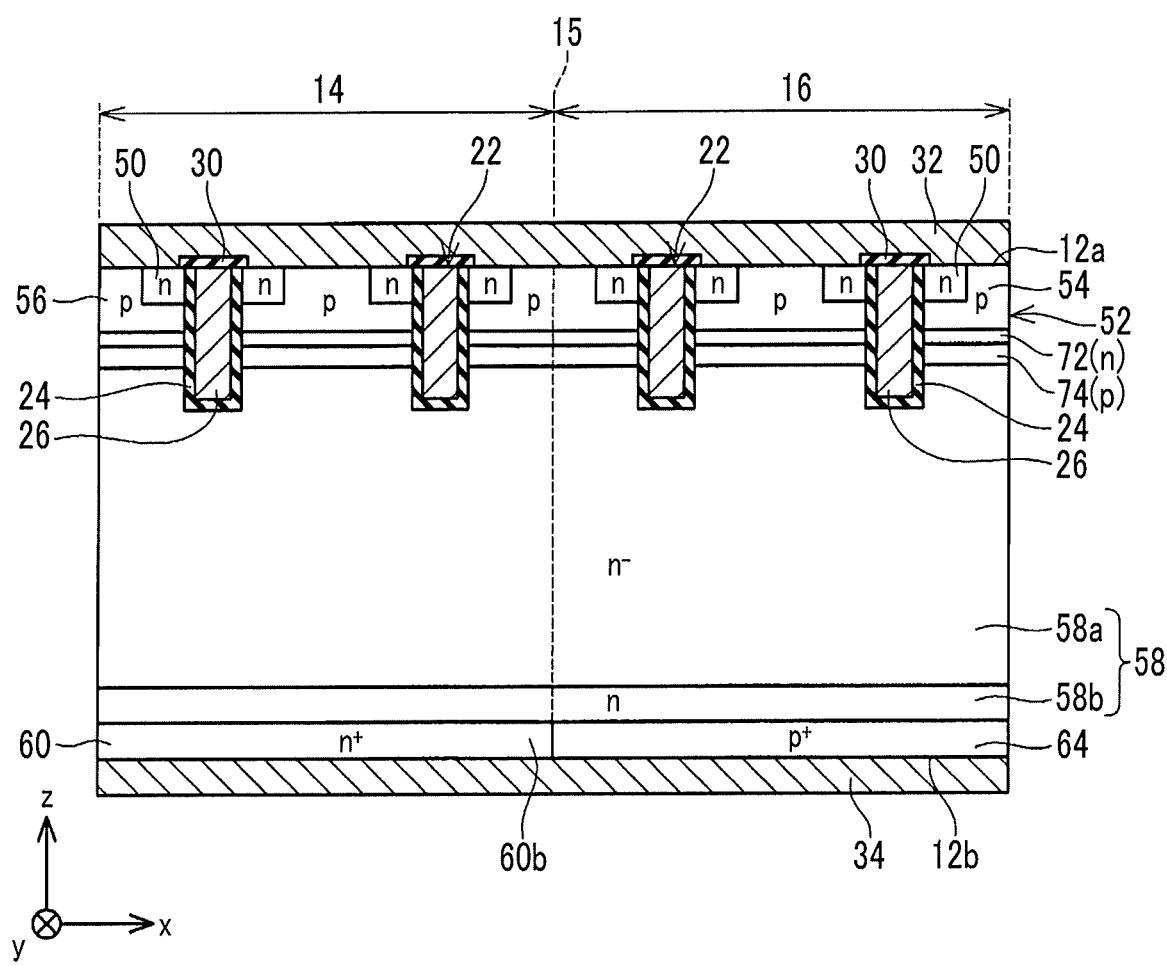
FIG. 21 is a sectional view corresponding to FIG. 4 of the semiconductor apparatus of the example.
Figure 22:
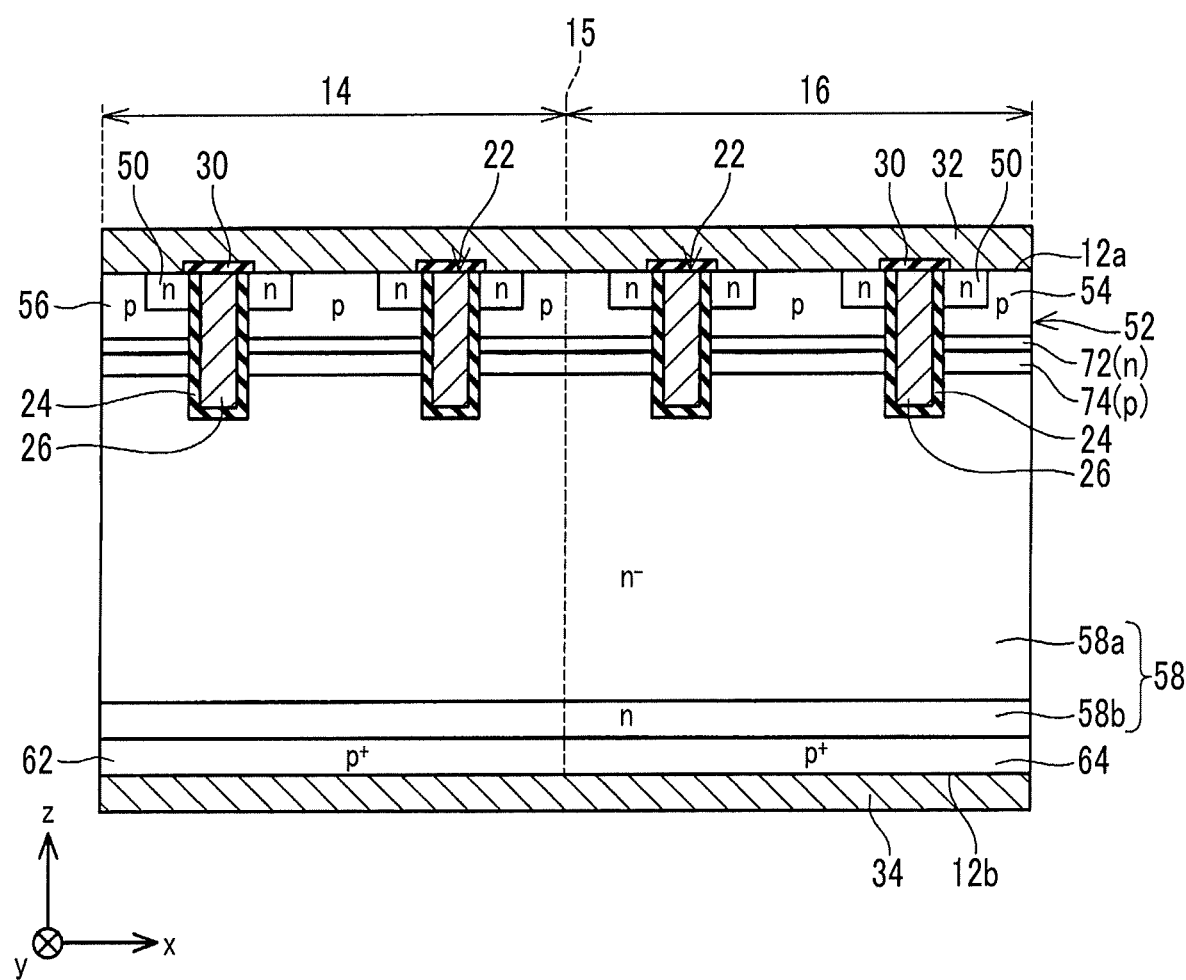
FIG. 22 is a sectional view corresponding to FIG. 5 of the semiconductor apparatus of the example.
Figure 23:
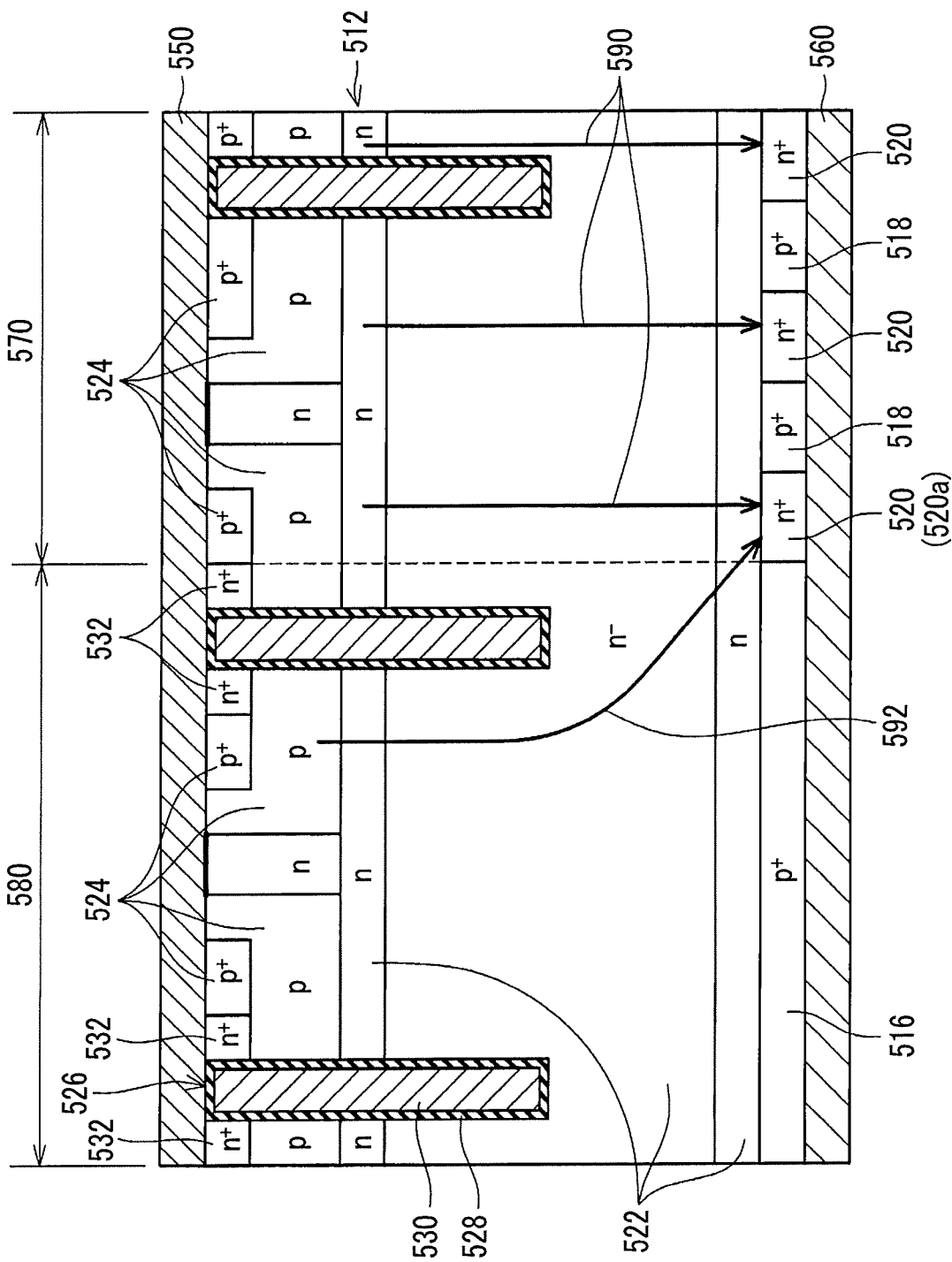
FIG. 23 is a sectional view of a semiconductor apparatus of the related art.

FIGS. 21 and 22 show a semiconductor apparatus of Example 6. In the semiconductor apparatus of Example 6, as in the semiconductor apparatus of Example 2, the trench 22, the gate insulating film 24, the gate electrode 26, and the insulating interlayer 30 are also provided in the diode range 14. However, in Example 6, the trench 22, the gate insulating film 24, the gate electrode 26, and the insulating interlayer 30 may not be provided in the diode range 14.

In the semiconductor apparatus of Example 6, an n-type barrier region 72 and a p-type lower body region 74 are disposed between the body region 52 and the drift region 58. Other configurations of the semiconductor apparatus of Example 6 are the same as those of the semiconductor apparatus of Example 2. The barrier region 72 is in contact with the body region 52 from below. The lower body region 74 is in contact with the barrier region 72 from below, and is in contact with the drift region 58 from the top. The barrier region 72 and the lower body region 74 are in contact with the gate insulating film 24. When the IGBT is turned on, a channel is formed in the body region 52 and the lower body region 74 in the IGBT range 16. With this, the emitter region 50 and the drift region 58 are connected, and the IGBT is turned on. When the diode is turned on, a current flows from the anode region 56 to the drift region 58 through the barrier region 72 and the lower body region 74. Since the n-type impurity concentration of the barrier region 72 is comparatively low, a current can flow through the barrier region 72. In the semiconductor apparatus of Example 6, as in the semiconductor apparatus of Example 2, it is possible to suppress concentration of the recovery current. Furthermore, the barrier region 72 and the lower body region 74 may be provided in the semiconductor apparatus of Example 1, 3, 4, or 5.

What is claimed is:

1. A semiconductor apparatus, comprising:
    a semiconductor substrate;
    an upper electrode disposed on an upper surface of the semiconductor substrate;
    a lower electrode disposed on a lower surface of the semiconductor substrate;
    a trench;
    a gate insulating film; and
    a gate electrode, wherein:
    the semiconductor substrate is provided with a plurality of diode ranges and a plurality of IGBT ranges;
    the IGBT ranges and the diode ranges are alternately arranged along a first direction in plan view of the semiconductor substrate along a thickness direction of the semiconductor substrate;
    each diode range is provided with a plurality of n-type cathode regions and a plurality of p-type current-limiting regions in a range of being in contact with the lower electrode;
    the n-type cathode regions and the p-type current-limiting regions are alternately arranged along a second direction intersecting the first direction in each diode range in plan view of the semiconductor substrate along the thickness direction;
    each IGBT range is provided with a p-type collector region in a range of being in contact with the lower electrode;
    the p-type collector region in each IGBT range is in contact with each n-type cathode region in the adjacent diode range;
    the semiconductor substrate includes
      an n-type drift region that is distributed over the diode ranges and the IGBT ranges, and is disposed above the n-type cathode regions, the p-type current-limiting regions, and the p-type collector regions, a p-type body region that is distributed over the diode ranges and the IGBT ranges, is disposed above the n-type drift region, and is in contact with the upper electrode in each diode range and each IGBT range, and an n-type emitter region that is disposed in each IGBT range, is in contact with the upper electrode, and is separated from the n-type drift region by the p-type body region;

the trench extends to have a depth passing through the n-type emitter region and the p-type body region from the upper surface of the semiconductor substrate and reaching the n-type drift region;

the gate insulating film covers an inner surface of the trench;

the gate electrode is disposed in the trench and is insulated from the semiconductor substrate by the gate insulating film;

the diode range includes a p-type hole blocking region that is in contact with at least a part of an upper surface of each n-type cathode region; and the n-type drift region is in contact with an upper surface of the p-type hole blocking region.

2. The semiconductor apparatus according to claim 1, wherein each n-type cathode region extends long along the first direction in plan view of the semiconductor substrate along the thickness direction.

3. The semiconductor apparatus according to claim 2, wherein a length of each n-type cathode region in the first direction is longer than a thickness of the semiconductor substrate.

4. The semiconductor apparatus according to claim 1, wherein:

the p-type hole blocking region is in contact with a part of an upper surface of each n-type cathode region; and the n-type drift region is in contact with an upper surface of the n-type cathode region in a range in which the p-type hole blocking region is not present.

5. The semiconductor apparatus according to claim 4, wherein the p-type hole blocking region is in contact with an upper surface of an end portion of the n-type cathode region in the first direction.

6. The semiconductor apparatus according to claim 1, wherein the p-type hole blocking region is in contact with at least one of the p-type current-limiting regions.

7. The semiconductor apparatus according to claim 6, wherein the p-type hole blocking region extends long in the second direction and is in contact with upper surfaces of the plurality of n-type cathode regions.

8. The semiconductor apparatus according to claim 7, wherein each diode range is provided with a plurality of p-type hole blocking regions.

9. The semiconductor apparatus according to claim 1, wherein:

the n-type drift region includes a buffer region that is in contact with the upper surface of the n-type cathode region and has an n-type impurity concentration lower than the n-type cathode region, and a low concentration region that is in contact with an upper surface of the buffer region and has an n-type impurity concentration lower than the buffer region; and a p-type impurity concentration of the p-type hole blocking region is lower than a p-type impurity concentration of the p-type collector region, a p-type impurity concentration of the p-type current-limiting region, and the n-type impurity concentration of the buffer region.

10. The semiconductor apparatus according to claim 1, wherein the trench extends long along the second direction in plan view of the semiconductor substrate along the thickness direction.

\* \* \* \* \*